US009258641B2

(12) United States Patent
Tuttle

(10) Patent No.: US 9,258,641 B2
(45) Date of Patent: Feb. 9, 2016

(54) METHOD AND SYSTEM OF AUDIO CAPTURE BASED ON LOGARITHMIC CONVERSION

(71) Applicant: QBiZ, LLC, Wilmington (New Castle), DE (US)

(72) Inventor: John R. Tuttle, Longmont, CO (US)

(73) Assignee: QBIZ, LLC, Wilmington (New Castle), DE (US)

( * ) Notice: Subject to any disclaimer, the term of this patent is extended or adjusted under 35 U.S.C. 154(b) by 703 days.

(21) Appl. No.: 13/625,513

(22) Filed: Sep. 24, 2012

(65) Prior Publication Data

US 2013/0329914 A1 Dec. 12, 2013

Related U.S. Application Data

(63) Continuation-in-part of application No. 13/490,555, filed on Jun. 7, 2012, now Pat. No. 9,066,022.

(51) Int. Cl.
*H04R 3/00* (2006.01)
*H03F 99/00* (2009.01)
*G06F 17/00* (2006.01)

(52) U.S. Cl.
CPC .............. *H04R 3/00* (2013.01); *H04R 2410/00* (2013.01)

(58) Field of Classification Search
CPC .............................. H04R 3/00; H04R 2410/00
USPC ............ 330/10; 341/20; 348/231.99; 381/18, 381/57, 81, 113, 120, 121, 122, 56; 84/609; 455/180.1; 713/176
See application file for complete search history.

(56) References Cited

U.S. PATENT DOCUMENTS 4,399,324 A * 8/1983 Ishida .................... H04H 40/63 381/3
4,745,465 A 5/1988 Kwon
5,165,071 A 11/1992 Moriya et al.
5,216,718 A * 6/1993 Fukuda ..................... H04S 5/02 381/18
5,281,754 A * 1/1994 Farrett ................. G10H 1/0025 84/609
5,751,819 A * 5/1998 Dorrough ............ H04R 29/008 381/119
6,704,869 B2 * 3/2004 Rhoads .............. G06K 9/00442 380/202
7,109,890 B2 * 9/2006 Sim ....................... G06F 3/0219 341/20
7,126,509 B2 10/2006 Sit et al.
7,218,900 B2 * 5/2007 Suzuki ...................... H04L 5/06 455/180.1
7,227,490 B2 6/2007 Kawahito
7,333,618 B2 * 2/2008 Shuttleworth ........... H03G 3/32 381/57

(Continued)

OTHER PUBLICATIONS

Arvo, James "Graphics Gems II", Program of Computer Graphics Cornell University, Ithaca, NY, 1991.

(Continued)

*Primary Examiner* — Gerald Gauthier
(74) *Attorney, Agent, or Firm* — Mark E. Scott; Conley Rose, P.C.

(57) ABSTRACT

Audio capture based on logarithmic conversion. At least some of the illustrative embodiments are methods including capturing audio represented by an electrical signal, the electrical signal having both positive voltage portions and negative voltage portions. In some cases, the capture is by: performing logarithmic analog-to-digital conversion on the positive voltage portions to create a first plurality of digital values; and performing logarithmic analog-to-digital conversion on the negative voltage portions to create a second plurality of digital values; and storing representations of the first and second plurality of digital values to a storage medium.

25 Claims, 11 Drawing Sheets

(56) References Cited

U.S. PATENT DOCUMENTS

| | | | | |
|---|---|---|---|---|
| 7,356,151 | B2 * | 4/2008 | Seknicka | H04R 3/00 381/113 |
| 7,498,876 | B2 * | 3/2009 | Peruzzi | H03F 1/0222 330/10 |
| 7,590,500 | B2 | 9/2009 | Jochum et al. | |
| 7,620,189 | B2 * | 11/2009 | Lang | H04R 3/00 330/297 |
| 7,645,978 | B2 | 1/2010 | Kamon | |
| 7,738,664 | B2 * | 6/2010 | Kawada | H04H 20/12 381/123 |
| 9,066,022 | B2 * | 6/2015 | Tuttle | H04N 5/23229 |
| 2006/0133546 | A1 | 6/2006 | Demir et al. | |
| 2006/0158529 | A1 | 7/2006 | Katagiri | |
| 2012/0105587 | A1 | 5/2012 | Lee et al. | |
| 2013/0108081 | A1 * | 5/2013 | Ozaki | H03F 1/0211 381/121 |
| 2013/0329084 | A1 * | 12/2013 | Tuttle | H04N 5/23229 348/231.99 |
| 2013/0329914 | A1 * | 12/2013 | Tuttle | 381/120 |
| 2015/0249780 | A1 * | 9/2015 | Tuttle | H04N 5/23229 348/231.6 |

OTHER PUBLICATIONS

Ward, Gregory, "The LogLuv Encoding for Full Gamut, High Dynamic Range Images", Silicon Graphics, Inc. Moutain View, CA, 1998.

"Analog-to-digital converter." Wikipedia.org. May 30, 2012. Web. Jun. 7, 2012.

Larson, Greg Ward. "Radiance File Formats." http://radsite.lbl.gov/radiance/refer/filefmts.pdf n.d. Web. May 30, 2012.

"IEEE 754-2008." Wikipedia.org. May 30, 2012. Web. May 30, 2012.

"RGBE image format." Wikipedia.org. Apr. 12, 2011. Web. May 30, 2012.

Maxim Integrated. "Application Note 3611—Integrated DC Logarithmic Amplifiers." http://www.maximintegrated.com/app-notes/index.mvp/id/3611 Sep. 25, 2005. Web. Sep. 27, 2012.

Analog Devices, Inc. "MT-077 Tutorial—Log Amp Basics." http://www.analog.com/static/imported-files/tutorials/MT-077.pdf 2009. Web. Sep. 27, 2012.

Holdenried, Chris D. et al. "A DC-4-GHz True Logarithmic Amplifier: Theory and Implementation." IEEE Journal of Solid State Circuits, vol. 37, No. 10. Oct. 2002.

Analog Devices, Inc. "160 dB Range (100 pA-10 mA) Logarithmic Converter—AD8304." http://www.analog.com/static/imported-files/data_sheets/AD8304.pdf 2002. Web. Sep. 27, 2012.

Burr-Brown Products from Texas Instruments. "LOG102—Precision Logarithmic and Log Ratio Amplifier." http://www.ti_com/lit/ds/symlink/log102.pdf 2005. Web. Sep. 27, 2012.

Philips Semiconductors. "Product Specification—True Logarithmic Amplifier—TDA8780M." http://www.classiccmp.org/rtellason/chipdata/tda8780.pdf Jul. 25, 1995. Web. Sep. 27, 2012.

GEC Plessey Semiconductors. Advance Information—SL531—250 MHz True Log IF Amplifier. http://www.ic72.com/pdf_file/s1591829.pdf 2001. Web. Sep. 27, 2012.

Chengdu AINFO Inc. "Detector Log Video Amplifier (DLVA)." http://www.ainfoinc.com/en/p_mwrf_dlva.asp Jan. 12, 2011. Web. Sep. 27, 2012.

Analog Devices, Inc. "120 dB Range (3 nA-3 mA) Dual Logarithmic Converter—ADL5310." http://www.analog.com/static/imported-files/data_sheets/ADL5310.pdf 2004. Web. Sep. 28, 2012.

Analog Devices, Inc. "Fast, Voltage-Out DC-440 MHz, 95 dB Logarithmic Amplifier—AD8310." http://www.datasheetcatalog.org/datasheet2/3/06dwykgyweoc1s3rtptuc7lprpfy.pdf 2004. Web. Sep. 28, 2012.

Analog Devices, Inc. "DC-Coupled Demodulating 120 MHz Logarithmic Amplifier—AD640." http://www.analog.com/static/imported-files/data_sheets/AD640.pdf 1999. Web. Sep. 28, 2012.

Choubey, Bhaskar et al. Models for Pixels With Wide-Dynamic-Range Combined Linear and Logarithmic Response, IEEE Sensors Journal, vol. 7, No. 7, Jul. 2007.

* cited by examiner

METHOD AND SYSTEM OF AUDIO CAPTURE BASED ON LOGARITHMIC CONVERSION

CROSS-REFERENCE TO RELATED APPLICATIONS

This application is a continuation-in-part of U.S. application Ser. No. 13/490,555 filed Jun. 7, 2012 titled "Method and system of image capture based on logarithmic conversion", which application is incorporated by reference herein as if reproduced in full below.

BACKGROUND

Achieving higher fidelity sound reproduction has been a goal since advent of sound recordings. Much of the early focus was on the sound reproduction equipment (e.g., power amplifiers, speakers). In the digital age, most of the focus has been on the audio file compression formats that nevertheless can be used for high fidelity playback. However, increases in fidelity are still possible.

BRIEF DESCRIPTION OF THE DRAWINGS

For a detailed description of example embodiments, reference will now be made to the accompanying drawings in which.

NOTATION AND NOMENCLATURE

Figure 1:
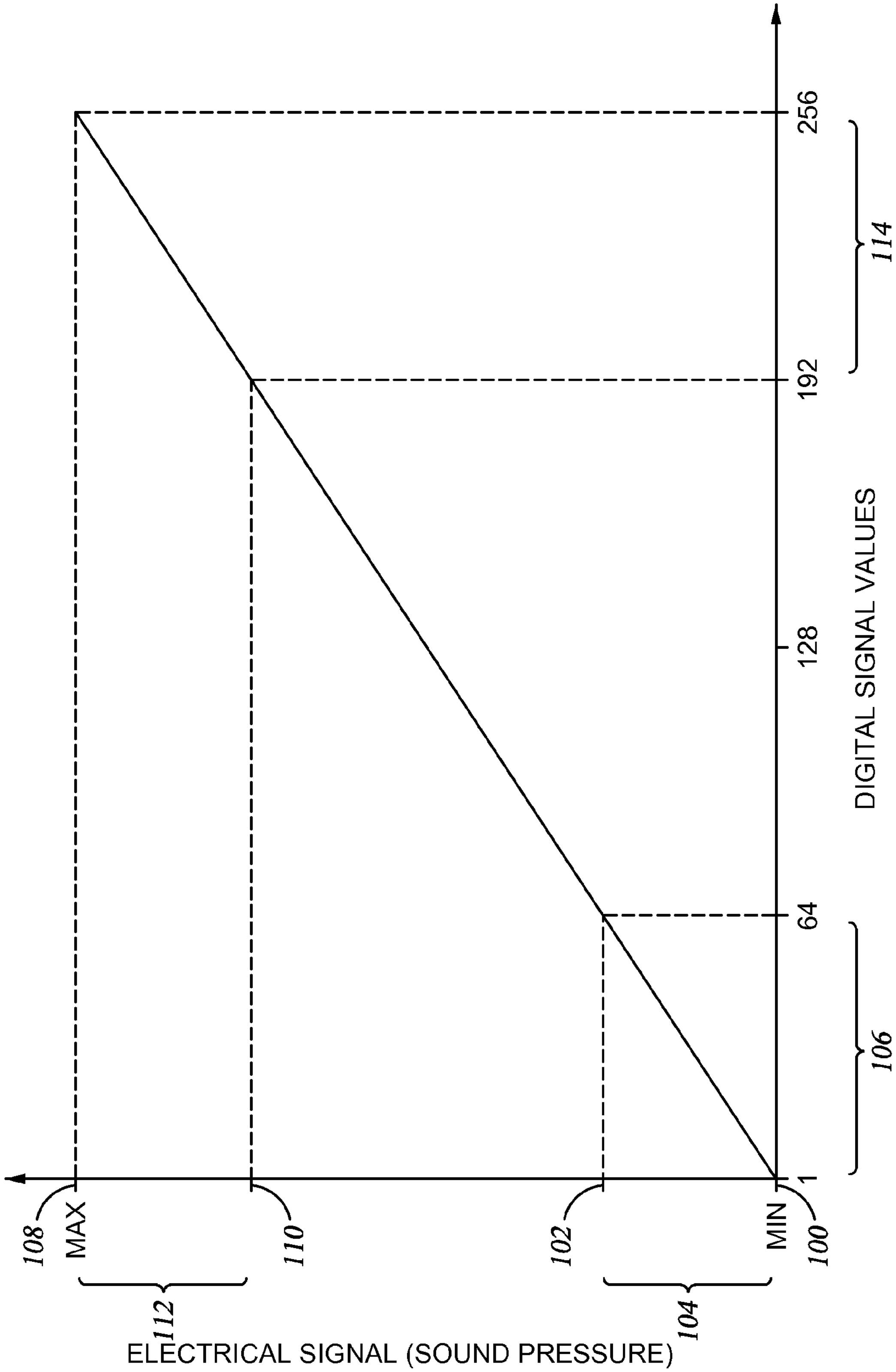
FIG. 1 shows a plot of electrical signal against digital signal values.

Certain terms are used throughout the following description and claims to refer to particular system components. As one skilled in the art will appreciate, different companies may refer to a component by different names. This document does not intend to distinguish between components that differ in name but not function.

In the following discussion and in the claims, the terms "including" and "comprising" are used in an open-ended fashion, and thus should be interpreted to mean "including, but not limited to . . . ." Also, the term "couple" or "couples" is intended to mean either an indirect or direct connection. Thus, if a first device couples to a second device, that connection may be through a direct connection or through an indirect connection.

"Logarithmic analog-to-digital conversion" shall mean that, for a plurality of analog values converted, a respective plurality of digital values is produced where the digital values are logarithmically related to the respective plurality of analog values. Creating a plurality of digital values linearly related to analog values and later modifying the plurality digital values to have a logarithmic relationship shall not be considered "logarithmic analog-to-digital conversion".

"Logarithmic analog-to-digital converter" shall mean a device or combination of devices that, for a plurality of analog values applied to the device(s), a respective plurality of digital values are produced where the digital values are logarithmically related to the respective plurality of analog values. A device that creates a digital value linearly related to an analog values in combination with later modifying the digital values to a logarithmic relationship shall not be considered a "logarithmic analog-to-digital converter". Moreover, incremental changes inherent in binary representation of a continuous function shall not obviate the status as logarithmic analog-to-digital converter. Moreover, localized departure from a logarithmic response (e.g., upper end of a conversion range, lower end a conversion range, temperature dependent changes) shall not obviate status as logarithmic analog-to-digital converter.

"Linear analog-to-digital converter" shall mean a device or combination of devices that produce a digital value that is linearly related an analog value. Incremental changes inherent in binary representation of a continuous function shall not obviate the linearity of a linear analog-to-digital conversion. Moreover, localized non-linearity (e.g., upper end of a conversion range, lower end a conversion range, temperature dependent changes) shall not obviate status as linear analog-to-digital conversion.

"Octave" shall mean a unit of measure corresponding to a range of intensities (e.g., perceived sound intensity), but octave shall not imply any relationship to or number of steps of a set of numbers that may reside within the octave or the number of octaves over the entire range of interest.

"About" in relation to a period of time shall mean that received events occur within 1 milli-second (ms) of each other.

DETAILED DESCRIPTION

The following discussion is directed to various embodiments of the invention. Although one or more of these embodiments may be preferred, the embodiments disclosed should not be interpreted, or otherwise used, as limiting the scope of the disclosure, including the claims. In addition, one skilled in the art will understand that the following description has broad application, and the discussion of any embodiment is meant only to be exemplary of that embodiment, and not intended to intimate that the scope of the disclosure, including the claims, is limited to that embodiment.

The various embodiments are directed to audio capture systems, such as mobile devices (e.g., wireless network-enabled devices), mobile cellular devices, video cameras, and other sound recording equipment. The specification first turns to identifying shortcomings in the related art.

Identifying Shortcomings of the Related-Art

Part of understanding why the example embodiments represent an advance in audio capture technology is an understanding of the shortcomings of related-art systems. In particular, many currently available audio capture devices convert sound pressure level linearly. "Linear" in the context of the identifying the shortcomings of related-art systems indicates that each digital representation of a sound pressure level is related to the analog signal created by a microphone in a straight line sense. That is, each digital value is related to the corresponding analog signal according to the equation:

$$VALUE_{DIGITAL}=M^*(\text{ANALOG VALUE})+\text{OFFSET} \quad (1)$$

where $VALUE_{DIGITAL}$ is the encoded digital value representation, M is gain value, ANALOG VALUE is the instantaneous analog signal created by a microphone, and OFFSET is an offset value.

Thus, digital representations of sound pressure level in many related-art systems are linearly related to the sound pressure level at the time the sample is taken. As an example, consider a system that uses an 8-bit linear analog-to-digital converter, such that digital values for the illustrative system may span the binary range {00000000→11111111} which in decimal is {0→255} (which for convenience will be considered to be {1→256}). Sound is a vibration of air molecules such that pressure at a location fluctuates around ambient pressure. A microphone converts the pressure fluctuations into a time varying electrical signal carried along an electrical conductor, where the electrical signal has both positive portions and negative portions. It is noted that an equivalent description of the function of a microphone can be made in terms of electrical current flow to and from the microphone, but so as not to unduly complicate the discussion the specification from this point forward considers the electrical signal only from a voltage perspective. Ignoring for now negative voltage portions of the electrical signal, in an example captured audio a zero voltage of the electrical signal takes the value 1 and the highest voltage of the electrical signal takes the value 256. Thus, using linear conversion of sound pressure level as converted to an electrical signal by a microphone (and again considering only positive voltage values or sound pressure levels higher than ambient), sound pressure level may be considered to be divided into 256 equally space steps along the range.

FIG. 1 shows a graph of the relationship between electrical signal level (Y-axis) and the digital signal values (X-axis) in this example situation (that is, ignoring for the moment negative values). In particular, for any electrical signal level (Y-axis), the corresponding digital signal value (X-axis) is linearly related as shown. Consider, for purposes of explanation, two electrical signal levels, one being the minimum electrical signal level (reference number 100 in the figure), and a second electrical signal level (reference number 102 in the figure) separated by a difference (reference number 104 in the figure). The difference 104 as between the two illustrative electrical signal values 100 and 102 results in an incremental change (reference number 106 in the figure) in the digital signal value. In the illustrative case of 8 bit linear analog-to-digital conversion, the example difference 104 results in a change of decimal 64 in the digital signal value. Now consider the same magnitude difference in electrical signal level at the upper end of the spectrum. That is, consider two electrical signal values, one being the maximum value (reference number 108 in the figure), and a second electrical signal level (reference number 110 in the figure), separated by a difference (reference number 112 in the figure) having the same magnitude as difference 104. The difference 112 as between the two illustrative electrical signal values 108 and 110 results in an incremental change 114 in the digital signal value. In the illustrative case of 8-bit linear analog-to-digital conversion, the example difference 112 results in a change of decimal 64 in the digital signal value (i.e., the difference between 192 and 256). Given the linear relationship between electrical signal level and digital signal values, and since the magnitude of the differences 104 and 112 are the same in this example, so too are the magnitudes of the incremental changes 106 and 114 within the digital signal values. The specification now turns to how humans perceive sound.

Humans perceive changes in sound pressure levels (i.e., sound intensity) non-linearly, and the relationship is approximately logarithmic. Consider, for example, a digital audio image created using the 8-bit analog-to-digital conversion discussed above. If digital signal values are applied to a digital-to-analog converter and then to a speaker, human perception views the difference of sound intensity from a value of decimal 1 to decimal 2 as a doubling of sound intensity; however, the next doubling of sound intensity is decimal 4 (2*2), not a decimal 3 (2+1). Likewise, the next doubling of sound intensity is decimal 8 (4*2), and so on. On the upper end of the digital signal values in the example, human perception views the difference of sound intensity from a value of decimal 128 to decimal 256 as a doubling of sound intensity.

A bit more precisely then, human perception of change of sound intensity follows the Weber-Fechner law, defined mathematically as:

$$B=k^*\ln(L/L_0) \quad (2)$$

where B is the change in apparent intensity to a human listener, k is a constant, L is the just-identifiable change in sound intensity, and $L_0$ is the previous sound intensity. Letting k equal 1, and applying the values described above with respect to the system performing 8-bit analog-to-digital conversion, the change in apparent sound intensity as between digital luminance values of decimal 1 and decimal 2 is B=ln (2/1)=0.693. Again with k equal 1, the change in apparent sound intensity as between digital luminance values of decimal 128 and decimal 256 is B=ln(256/128)=0.693. The precise value 0.693 is of little consequence, but note that the change in apparent sound intensity in the two example situations is exactly the same in spite of the number of steps between the respective analyzed values.

Figure 2:
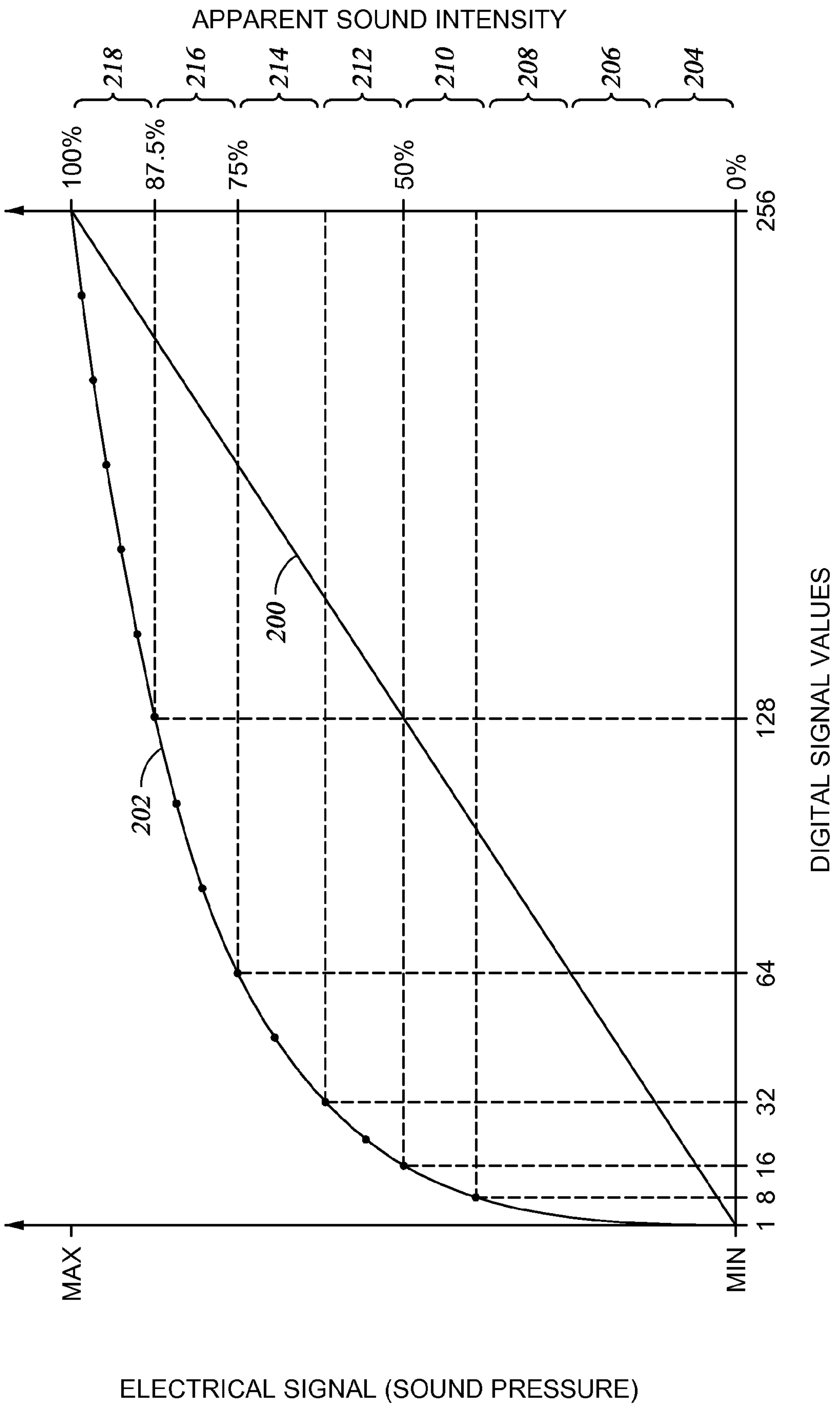
FIG. 2 shows a plot of electrical signal against digital signal values, and also apparent sound intensity against digital signal values.

The inventor of the present specification has found that the linear analog-to-digital conversion used in related-art audio capture systems, considered with the human's logarithmic perception of sound intensity, degrades fidelity by storing or recording too much information in the higher sound intensity ranges and too little information in the lower sound intensity ranges. In order to highlight this point, FIG. 2 is presented, which helps graphically illustrate at least some shortcomings of related-art systems. In particular, FIG. 2 relates positive levels of the electrical signal (Y-axis on the left) against the range of possible digital signal values (X-axis, illustratively ranging from 1 to 256) by way of solid line 200, where the relationship is linear. Co-plotted on the same graph is human perception of sound intensity (Y-axis on the right (with an arbitrary scale of 0 to 100%)) with respect to the digital signal values (again, the X-axis) by way of dash-dot-dash line 202. Thus, as with respect to FIG. 1, FIG. 2 illustrates a linear relationship between electrical signal level and the digital signal values by way of line 200. However, FIG. 2 also shows the human perception of sound intensity by way of line 202 against the range of possible digital signal values, and that the relationship between the digital signal values and the apparent sound intensity is non-linear, and in fact is logarithmic.

By performing linear analog-to-digital conversion, the related-art audio capture systems store too much information with respect to the higher sound intensity ranges, and too little information with respect to the lower sound intensity ranges. Again, human perception perceives the change in sound intensity between a decimal 128 value and a decimal 256 value as doubling of sound intensity. Thus, as shown in the illustrative case of FIG. 2, half the bit width of the digital signal values in this example populates the range of the highest 12.5% (87.5% to 100%) of the apparent sound intensity—half the bit width encodes changes in what a human may perceive as loudest portion of the sound. The remaining 128 decimal values—the lower half the bit width of the digital signal values in this example—populates the range of the lowest 87.5% of the apparent sound intensity.

Stated in terms of granularity or quantization between doubling of apparent sound intensity, the difference in sound intensity as perceived by a human having a peak value of decimal 128 and a sound intensity having a peak value of decimal 256 will be a doubling of apparent sound intensity, in this case with 128 gradations between. The difference in sound intensity as perceived by a human having a peak of decimal 64 and a sound intensity having a peak of decimal 128 will again be a doubling of apparent sound intensity, with 64 gradations between. The difference in sound intensity as perceived by a human having a peak of decimal 32 and a sound intensity having a peak of decimal 64 will be a doubling of apparent sound intensity, with 32 gradations between. The difference in sound intensity as perceived by a human having a peak of decimal 16 and a sound intensity having a peak of decimal 32 will be a doubling of apparent sound intensity, with 16 gradations between. The difference in sound intensity as perceived by a human having a peak of decimal 8 and a sound intensity having a peak of decimal 16 will be a doubling of apparent sound intensity, with 8 gradations between. The difference in sound intensity as perceived by a human having a peak of decimal 4 and a sound intensity having a peak of decimal 8 will be a doubling of apparent sound intensity, with 4 gradations between. The difference in sound intensity as perceived by a human having a peak of decimal 2 and a sound intensity having a peak of decimal 4 will be a doubling of apparent sound intensity, with 2 gradations between. Finally, the difference in sound intensity as perceived by a human having a decimal 1 and a sound intensity having a peak value of decimal 2 will be still be a doubling of apparent sound intensity.

The information discussed in the immediately previous paragraph is reproduced in the table form below:

TABLE 1

| START VALUE | STOP VALUE | QUANTIZATION |
|---|---|---|
| 1 | 2 | 1 |
| 2 | 4 | 2 |
| 4 | 8 | 4 |
| 8 | 16 | 8 |
| 16 | 32 | 16 |
| 32 | 64 | 32 |
| 64 | 128 | 64 |
| 128 | 256 | 128 |
| | Total | 256 |

Notice how the granularity within each doubling of perceived sound intensity gets smaller at the lower luminance ranges.

In order to help quantify the difference between the related-art systems and the various example embodiments discussed below, the range of apparent sound intensity in FIG. 2 is logically divided into eight equally spaced divisions or "octaves" (labeled octave 204, 206, 208, 210, 212, 214, 216, and 218) where the divisions are based on doubling in apparent sound intensity. While in the example situation of an 8-bit linear analog-to-digital conversion nicely divides into eight octaves, any number of octaves may be chosen (e.g., ten octaves). Thus, octave 218 represents the loudest or highest sound intensity octave, and octave 204 represents the most quiet or lowest sound intensity octave.

While each illustrative octave represents a doubling of apparent sound intensity, FIG. 2 also shows that the granularity or quantization within each octave is overloaded in the upper octaves. Thus, for example, peak sound intensity values in octave 218 can have any of 128 possible digital signal values. Peak sound intensity values in octave 216 can have any of 64 possible digital signal values. Jumping to the lowest octave 204, peak sound intensity values in octave 204 can have only a value of decimal 1 or a value of decimal 2. Thus, even though the human ear and brain can perceive a great number of levels of sound intensity within each octave, very little information is stored in the lower octaves in comparison to the upper octaves. Table 2 immediately below is similar to Table 1 above, but also includes the octave information (the reference number for each octave shown parenthetically).

TABLE 2

| OCTAVE | START VALUE | STOP VALUE | QUANTIZATION |
|---|---|---|---|
| 1 (204) | 1 | 2 | 1 |
| 2 (206) | 2 | 4 | 2 |
| 3 (208) | 4 | 8 | 4 |
| 4 (210) | 8 | 16 | 8 |
| 5 (212) | 16 | 32 | 16 |
| 6 (214) | 32 | 64 | 32 |
| 7 (216) | 64 | 128 | 64 |
| 8 (218) | 128 | 256 | 128 |
| | | Total | 256 |

Thus, too much information is encoded with respect to the upper sound intensity ranges (the upper octaves), and too little is encoded with respect to the lower sound intensity ranges (the lower octaves).

Before proceeding, note again the discussion has focused only on the positive portions of the electrical signal. However, sound is pressure waves, which the microphone converts to a time varying electrical signal. If one considers a pure sine wave tone at "middle" C (i.e., 440 Hertz (Hz)), the voltage of the electrical signal swings from a positive peak voltage to a negative peak voltage and back to the positive peak voltage 440 times per second. Moreover, for high fidelity audio recording, the original electrical signal may be sampled at the Nyquist rate or above—twice the peak frequency. If the upper limit of human hearing is 20,000 Hz, the Nyquist rate may be 40,000 Hz, meaning there may be about 90 samples of a complete period of the electrical waveform representing the example 440 Hz tone. For a pure tone, half the sampled values will be negative. The same issues with respect to quantization exist for the negative portion of the electrical signal. That is, using linear analog-to-digital conversion results in over-quantization of the greater magnitude values in the negative portions, and under quantization of the values closer to zero volts in the negative portions.

Wider A/D Conversion does not Address the Problem

One approach to obtain higher resolution is merely to use a "wider" linear analog-to-digital conversion. For example, rather than use an 8-bit linear analog-to-digital conversion, one approach is use of 12-bit linear analog-to-digital conversion, or perhaps a 16-bit linear analog-to-digital conversion.

However, even a wider linear analog-to-digital conversion does not fully address the issue.

Assume for purposes of explanation that a manufacturer of audio recording equipment wishing to store data with greater resolution modifies a system to have a 16-bit linear analog-to-digital conversion rather than the 8-bit linear analog-to-digital conversion used in the example above. There are a host of problems that would dissuade a manufacturer from making a switch to a 16-bit linear analog-to-digital conversion, not the least of which are increased price, and increased power requirements resulting in shorter battery life for portable devices. Notwithstanding these issues, consider FIG. 3, which is similar to FIG. 2, except based on use of a 16-bit linear analog-to-digital conversion.

Figure 3:
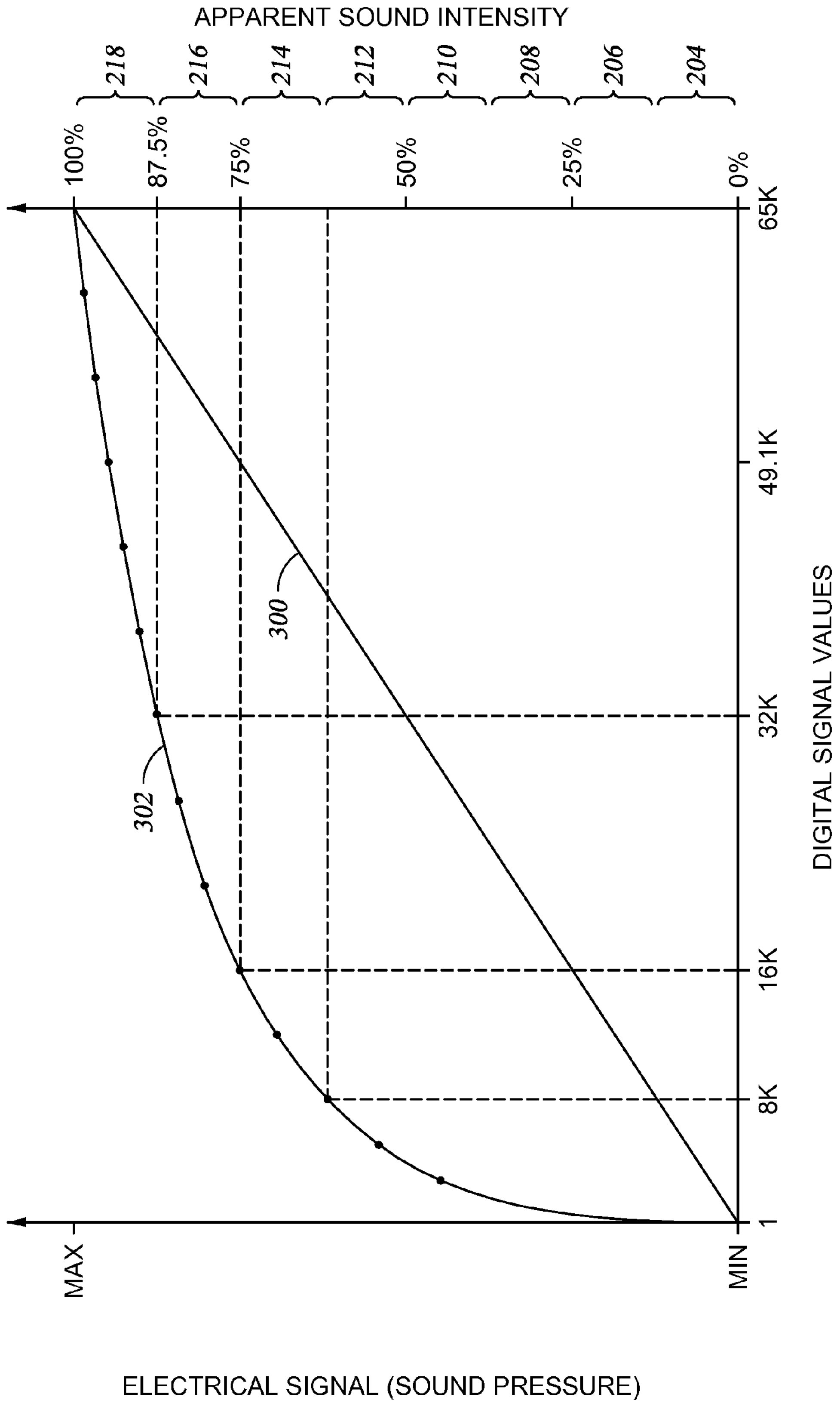
FIG. 3 shows a plot of electrical signal against digital signal values, and also apparent sound intensity against digital signal values.

In particular, FIG. 3 shows electrical signal (Y-axis on the left) against the range of possible digital signal values (X-axis, illustratively ranging from 1 to 65,536) by way of solid line 300, where the relationship is linear. Co-plotted on the same graph is human perception sound intensity (Y-axis on the right (with an arbitrary scale of 0 to 100%)) with respect to the digital signal values (again, the X-axis) by way of dash-dot-dash line 302. Thus, as with respect to FIG. 2, FIG. 3 illustrates a linear relationship between electrical signal level and the digital signal values by way of line 300. However, FIG. 3 also shows the human perception sound intensity by way of line 302 against the range of possible digital signal values, and again that the relationship between the digital signal values and the apparent sound intensity is non-linear.

For the same electrical signal range as between FIG. 2 and FIG. 3, the human perception sound intensity will not change. Thus, line 302 is the same as in FIG. 2, and the octave assignments (along the right Y-axis) remain the same. It follows that, under these assumptions, human perception of the change in sound intensity between a decimal 32,768 value and a decimal 65,536 value as doubling of sound intensity. As shown in the illustrative case of FIG. 3, half the bit width of the digital signal values in this example (32,768 decimal values) populate upper most octave 218. Stated in terms of granularity or quantization between doubling of apparent sound intensity, the difference in sound intensity as perceived by a human having a peak value of decimal 32,768 and sound having a peak value of decimal 65,536 (octave 218) in this example will be a doubling of apparent sound intensity, in this case with 32,768 gradations between. The difference in sound having a peak value of decimal 16,384 and sound having a peak value of decimal 37,768 (octave 216) will be a doubling of sound intensity, with 16,384 gradations between. Skipping to the lower most octave, the difference in sound having a peak value of decimal 1 and sound having a peak value of decimal 2 (octave 204) will be a doubling of apparent sound intensity. Thus, even if 16-bit linear analog-to-digital conversion could be used in the example systems, the 16-bit conversion still overloads storage in the upper octaves, and stores too little information in the lower octaves. No amount of post-processing can recover information for illustrative octave 204—the information is simply not recorded.

One additional point is made with reference to FIG. 3, which ties in with aspects later presented. The mathematical center of the digital signal values in linear analog-to-digital conversion is not the center of the apparent sound intensity scale—the mathematical center is in the upper octaves of the apparent sound intensity. For example, if one assumes that for a particular audio capture the lowest digital signal value is a decimal 1, and the highest digital signal value is a decimal 65,536, the average of the two values is about 32,768. For the example situation of eight zones and the audio capture spanning the entire dynamic range of the linear analog-to-digital conversion, the average or mathematical center of the digital signal values is not the center or midpoint of the apparent sound intensity. Rather, the example 32,768 average value resides at or very near the upper most octave 218.

A few additional points before proceeding. Firstly, the log of a negative value is not defined in mathematics, but the time varying electrical signal associated with a microphone swings both positive and negative. Through creative circuit design it is possible to create a logarithmic amplifier that operates in a mirror fashion for negative voltages. That is, the logarithmic relationship of positive input voltage to positive output voltage is "mirrored" across the Vin axis to provide output voltage for negative signals. However, the logarithmic amplifiers that function across the zero point do not have sufficient dynamic range for high fidelity audio capture. Expanding the range sufficiently may require piecewise linear systems (i.e., linear in the sense of a continuous function with no step values, as opposed to linear in a straight line sense). That is a plurality of gain sections whose outputs are summed together and, in a piecewise sense, approximate a logarithmic transfer function. Piecewise linear logarithmic conversion, however, introduces errors that are audibly noticeable with respect to high fidelity audio capture.

Example Embodiments

Figure 4:
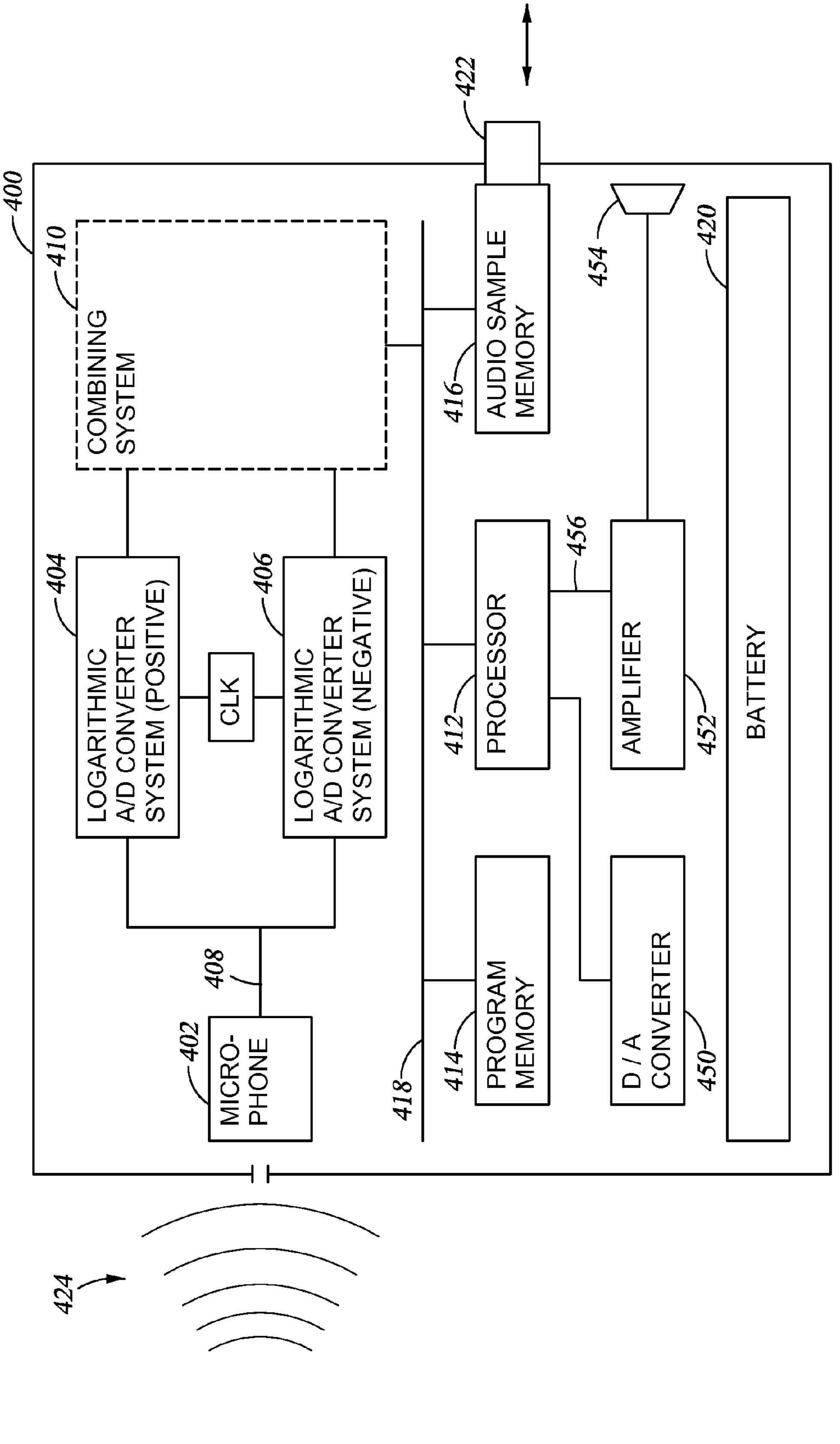
FIG. 4 shows, in block diagram form, an audio capture system in accordance with at least some embodiments.

The issues noted above are addressed, at least in part, by use of logarithmic analog-to-digital conversion to create captured audio. FIG. 4 shows, in block diagram form, a system in accordance with at least some embodiments. In particular, FIG. 4 shows an audio capture system 400, which may be illustrative of any device which captures and stores audio, such as mobile cellular device, a digital camera, and studio-based audio recording equipment. The system 400 comprises a microphone 402 coupled to a set of logarithmic analog-to-digital converter systems 404 and 406 by way of an input signal line 408. As will be discussed in great detail below, the logarithmic analog-to-digital converter system 404 may be dedicated to conversion of the positive portion of analog input signals created by the microphone 402, while the logarithmic analog-to-digital converter system 406 may be dedicated to conversion of the positive portion of analog input signals created by the microphone 402. The logarithmic analog-to-digital converter systems 404 and 406 couple to a combining system 410. The combining system 410 is shown in dashed lines as the combining system may be implemented in hardware or in software.

The audio capture system further comprises processor 412 coupled to a program memory 414 and an audio sample memory 416 by way of a communication bus 418. In cases where the audio capture system 400 is a portable device, the audio capture system 400 may further comprise a battery 420. The electrical connections of the battery 420 to the various other components of the audio capture system 400 are omitted so as not to unduly complicate the figure.

The microphone 402 may take any suitable form for converting sound pressure waves 424 into signals for further operation. For example, the microphone may be a moving-coil microphone, a carbon microphone, a piezoelectric microphone, or a fiber optic microphone. For microphones that produce an alternating current (AC) signal "riding" a direct current (DC) bias, additional filtering and amplification circuits may be used to create the time varying (i.e., AC) electrical signal carried on the input signal line 408. In the case of an optical microphone, additional circuitry may be used to create the electrical signal on the input signal line 408 responsive to the light modulation from the microphone. Although only a single microphone 402 is shown in FIG. 4 (representing a single channel system), multiple microphones (and correspondingly multiple converter systems, etc.) may be present. The discussion continues with respect to single channel system with the understanding that additional channels (e.g., two channels, or five channels) may likewise be implemented.

Logarithmic analog-to-digital converter system 404 couples on an analog side to the input signal line 408, and couples on a digital side to the processor 412 either directly, or through the combining system 410. Various example embodiments of the logarithmic analog-to-digital converter system 404 are discussed in greater detail below, but for now consider that the converter system 404 comprises a circuit or combination of circuits such that, for each positive analog signal sampled, the logarithmic analog-to-digital converter system 404 produces a digital value that is logarithmically related to the positive voltage analog signal. In particular, the logarithmic analog-to-digital converter system 404 may create digital values based on analog input signals according to Equation 3:

$$VALUE_{DIGITAL}=\text{Log}_B(\text{ANALOG VALUE})+\text{OFFSET} \quad (3)$$

where $VALUE_{DIGITAL}$ is the encoded digital value representation, ANALOG VALUE is the analog signal from the microphone sampled, B is base of the logarithm, and OFFSET is an offset value.

Similarly, logarithmic analog-to-digital converter system 406 couples on an analog side to the input signal line 408, and couples on a digital side to the processor 412 either directly, or through the combining system 410. Various example embodiments of the logarithmic analog-to-digital converter system 406 are discussed in greater detail below, but for now consider that the converter system 406 comprises a circuit or combination of circuits such that, for each negative analog signal sampled, the logarithmic analog-to-digital converter system 404 produces a digital value that is logarithmically related to the absolute value of the instantaneous negative analog signal. In particular, the logarithmic analog-to-digital converter system 406 may create digital values based on analog input signals according to Equation 4:

$$VALUE_{DIGITAL}=\text{Log}_B(|\text{ANALOG VALUE}|)+\text{OFFSET} \quad (4)$$

where $VALUE_{DIGITAL}$ is the encoded digital value representation, |ANALOG VALUE| is the absolute value of the analog signal from the microphone sampled, B is base of the logarithm, and OFFSET is an offset value.

Still referring to FIG. 4, processor 412, executing instructions, controls various aspects of the audio capture system 400. The processor 412 may be any suitable processor, such as a standalone processor, a microcontroller, a signal processor, state machine, or an application specific integrated circuit (ASIC) specially designed for audio capture operations. For example, in some cases the processor may be a Part No. ATMega328P-PU microcontroller available from Atmel Corporation of San Jose, Calif. In some cases, the instructions executed by the processor 412 may be stored in a program memory 414 which may be a non-volatile memory device, such as read-only memory (ROM), electrically erasable programmable ROM (EEPROM), or flash memory. The processor may have a working memory to which programs are copied for execution, or the processor may execute the instructions directly from the program memory.

The illustrative audio capture system 400 further comprises an audio sample memory 416 coupled to the processor 412. As the name implies, the audio sample memory 416 may be the location to which digital representations of the captured audio are stored. In some cases, the processor 412 may read digital values from the logarithmic analog-to-digital converter systems 404 and 406 and write the values to the image memory 416, but in other cases the digital values may be directly written through a direct memory access (DMA) system. In many cases, the audio sample memory 416 may comprise a removable memory card or stick 422, such that the captured audio may be transferred to other devices. The audio sample memory 416 may thus comprise any suitable removable memory system or device, such as a Secure Digital (SD) card memory or flash memory device. The remaining portions of FIG. 4 related to audio playback, and will be discussed below.

Figure 5:
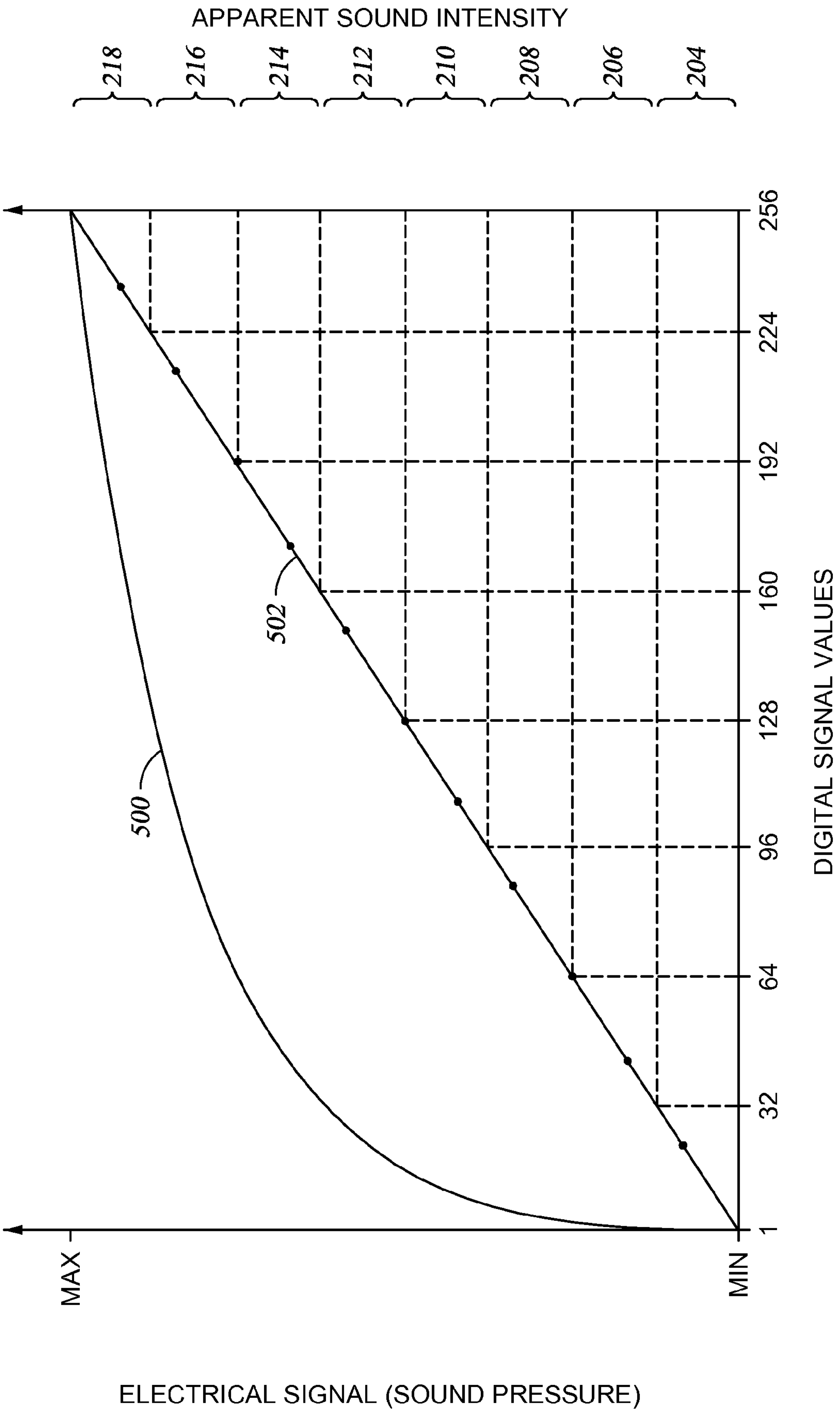
FIG. 5 shows a plot of electrical signal against digital signal values, and also apparent sound intensity against digital signal values, in accordance with at least some embodiments.

Having now described the illustrative audio capture system 400, the specification turns to a description of operation using the logarithmic analog-to-digital converter system 404, and how such operation addresses, at least in part, the issues noted with respect to the related-art systems. In particular, FIG. 5 shows a graph relating electrical signal (Y-axis on the left) against the range of possible digital signal values (X-axis) by way of solid line 500 for an example 8-bit logarithmic analog-to-digital conversion (thus, the digital values range from 1 to 256). Co-plotted on the same graph is human perception of sound intensity (Y-axis on the right (with an arbitrary scale of 0 to 100%)) with respect to the digital signal values (again, the X-axis) by way of dash-dot-dash line 502. Further, the graph of FIG. 5 shows the illustrative octaves 204, 206, 208, 210, 212, 214, 216, and 218. As with the previous figures, FIG. 5 is only with respect to the positive portions of the electrical signal, but a similar relationship exists with respect to the absolute value of the negative portions.

Thus, FIG. 5 illustrates a logarithmic relationship between instantaneous electrical signal level and the digital signal values by way of line 500. FIG. 5 also shows the human perception of sound intensity by way of line 502 against the range of possible digital signal values taking into account the logarithmic analog-to-digital conversion. By performing logarithmic analog-to-digital conversion, the information regarding sound intensity is better distributed within each illustrative octave. Again considering human perception of sound intensity, given the logarithmic analog-to-digital conversion, the change in sound intensity between a decimal 224 value and a decimal 256 value will be viewed as a doubling of sound intensity, with 32 gradations between them. The difference in sound intensity as perceived by a human having a peak value of decimal 192 and sound intensity having a peak value of decimal 224 will be a doubling of apparent sound intensity, in this case with 32 gradations between. Skipping to the lower octaves, the difference in sound intensity having a peak value of decimal 32 and sound intensity having a peak value of decimal 64 will be a doubling of apparent sound intensity, with 32 gradations between. Finally, the difference in sound intensity having a peak value of decimal 1 and sound intensity having a peak value of decimal 32 will be a doubling of apparent sound intensity, with 32 gradations between.

While each illustrative octave represents a doubling of apparent sound intensity, FIG. 5 also shows that the granularity or quantization within each octave is evenly distributed about the octaves. Table 3 immediately below shows the information of the immediately previous paragraph in table form.

TABLE 3

| OCTAVE | START VALUE | STOP VALUE | QUANTIZATION |
|---|---|---|---|
| 1 (204) | 1 | 32 | 32 |
| 2 (206) | 32 | 64 | 32 |
| 3 (208) | 64 | 96 | 32 |
| 4 (210) | 96 | 128 | 32 |
| 5 (212) | 128 | 160 | 32 |
| 6 (214) | 160 | 192 | 32 |
| 7 (216) | 192 | 224 | 32 |
| 8 (218) | 224 | 256 | 32 |
| | | Total | 256 |

Thus, the various embodiments more evenly distribute the quantization across the octaves from a granularity standpoint as related to human perception. Table 4 shows, for the example eight octaves and 8-bit analog-to-digital conversion, how the linear and logarithmic conversions compare.

TABLE 4

| OCTAVE | QUANTIZATION (LINEAR) | QUANTIZATION (LOGARITHMIC) |
|---|---|---|
| 1 | 1 | 32 |
| 2 | 2 | 32 |
| 3 | 4 | 32 |
| 4 | 8 | 32 |
| 5 | 16 | 32 |
| 6 | 32 | 32 |
| 7 | 64 | 32 |
| 8 | 128 | 32 |
| Total | 256 | 256 |

With respect to post-processing, in this example there is insufficient data until one reaches the sixth octave in the linear systems to recreate the granularity in the corresponding octaves in the logarithmic system.

Wider Effective Capture Range

The specification now turns to the concepts of dynamic range of capture. Imagine a situation where a loud instrument, such as trumpet played as loud as possible, plays alongside a quite instrument, such as cello played very softly. The sound that propagates to the listener will be a combination of the sound from the two instruments, and thus in the example the sound will have widely varying dynamic range. The example situation, the trumpet may have a peak dynamic range approaching that of human hearing—around 120 decibels (dB). By contrast, an audio capture system with 10-bit linear analog-to-digital conversion theoretically has only a 60 dB capture range ($2^{10}$=1024, and 20 log (1024)=60 dB), though many currently available microphones capture the entire dynamic range of human hearing—again 120 dB. From the study above, however, it is clear that in spite of the theoretical range of a 10 bit linear analog-to-digital conversion, in actuality the effective range is less as caused by the under quantization in the lower octaves. Table 4 above suggests that roughly half the octaves are under quantized, making the effective dynamic range of linear analog-to-digital closer to about 30 dB. Table 5 shows a relationship between a linear analog-to-digital conversion and logarithmic analog-to-digital conversion for a 10-bit system and 8 octaves to highlight again the effective breadth of the audio capture for wider conversion systems.

TABLE 5

| OCTAVE | QUANTIZATION (LINEAR) | QUANTIZATION (LOGARITHMIC) |
|---|---|---|
| 1 | 1 | 128 |
| 2 | 8 | 128 |
| 3 | 16 | 128 |
| 4 | 32 | 128 |
| 5 | 64 | 128 |
| 6 | 128 | 128 |
| 7 | 256 | 128 |
| 8 | 512 | 128 |
| Total | 1024 | 1024 |

If you consider that somewhere between 64 and 128 quantization steps within each octave is the subjective point where degradation becomes noticeable to an ordinary listener. Table 5 thus highlights again that the effective dynamic range for the linear conversion is about half (arguably less than half given the 64 quantization steps in illustrative zone 5) that of the logarithmic conversion in the positive quadrant.

Gain Control

The specification now turns to gain control in accordance with at least some embodiments. As an aid in discussing the concepts of gain control, attention is directed to FIG. 6 which plots digital signal values (Y-axis) against apparent sound intensity across the entire audio range (X-axis in a logarithmic scale). In particular, dashed line 600 plots the relationship between digital signal values against sound intensity if the bit-width of the digital signal values was sufficient to capture the positive audio sound intensity range. However, for purposes of this portion of the discussion, assume that the dynamic range of the sound intensity peaks at line 602 rather than at the entire dynamic range of human hearing. The audio capture system 400 may operate "tuned" such that line 600 represents the relationship between the digital signal values and the sound intensity range; however, under the assumption that the dynamic range peaks at the vertical line 602, a goodly portion of the bit-width of the digital signal values may go unused.

However, in accordance with at least some embodiments additional controls may be implemented, the additional controls in the form of gain control within the logarithmic analog-to-digital converter systems 404 and 406. For example, by controlling the gain applied within each of the logarithmic analog-to-digital converter systems, control of the relationship of the digital signal values to the peak sound intensity may be adjusted to further increase the fidelity of the recording. That is, when the peak sound intensity is below dynamic range of the logarithmic analog-to-digital converter systems 404 and 406, the gain of each converter systems may be adjusted to better match, which creates greater quantization within each octave. Example logarithmic analog-to-digital converter systems are discussed more below. For example, by increase the gain with the logarithmic analog-to-digital converter systems, the relationship of the digital luminance values to the sound intensity may be shifted counter clockwise about the origin, as shown by solid line 604. Likewise, if a previous recording used high gain based on a low dynamic range of the sound intensity, by lowering the gain the relationship of the digital signal values to the sound intensity may be shifted about the origin back to that of dashed line 600, or anywhere between.

Figure 6:
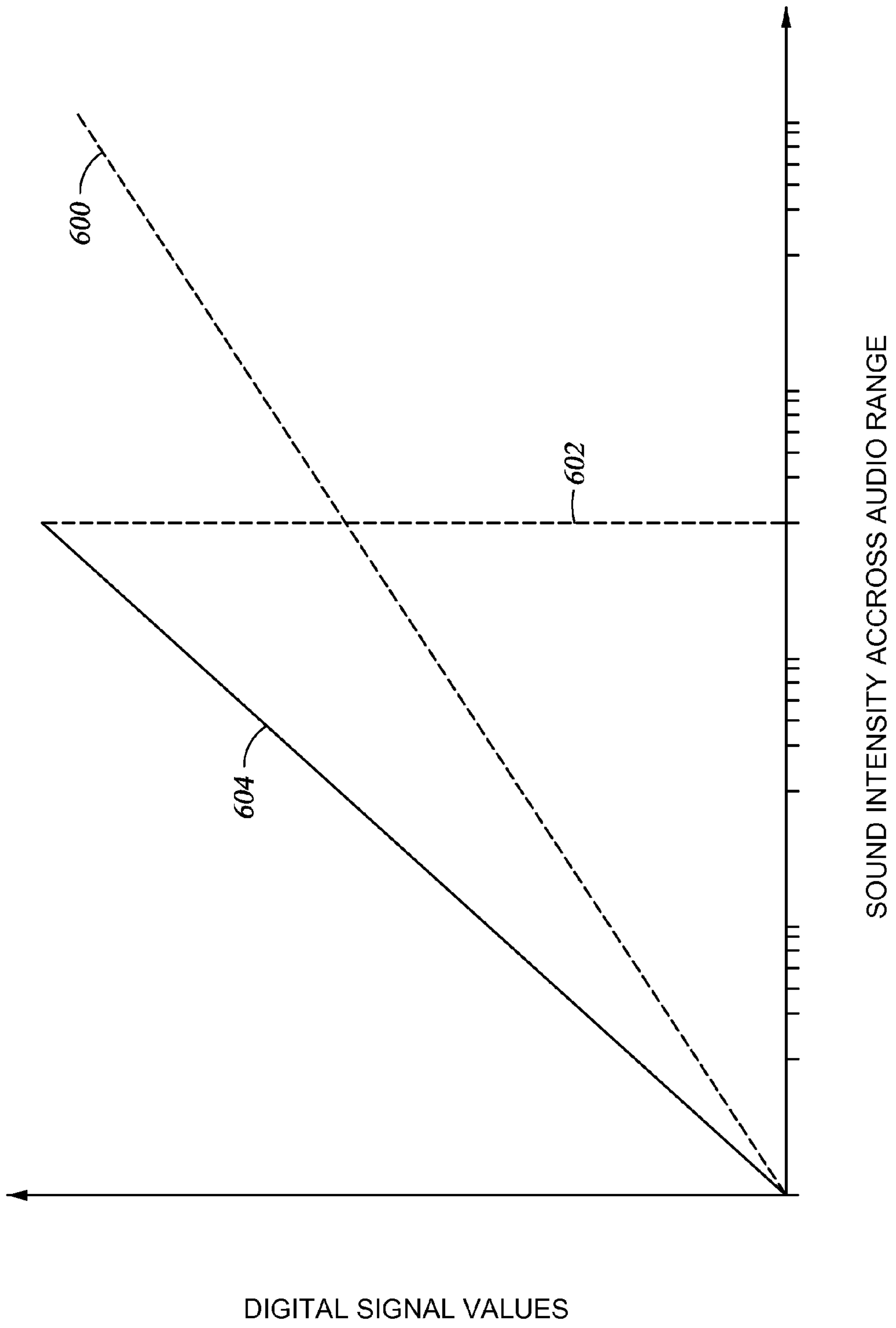
FIG. 6 shows a plot of digital signal values against sound intensity (log) in accordance with at least some embodiments.

The gain control in relation to FIG. 6 is a changing of the slope of line 602 to be greater (closer to vertical), or lesser (closer to horizontal). Considered more mathematically, and considering again Equation (3) above, changing the gain is effectively a change in the base B of the logarithm conversion. For example, by lowering the gain, the relationship of the digital signal values to the sound intensity may be shifted such that a greater sound intensity range is capture within the range of the digital signal values. Such a shift results in fewer gradations within each octave (the octaves not specifically shown). Likewise, by raising the gain, the relationship of the digital signal values to the sound intensity may be shifted such that a lesser luminance range is captured within the range of the digital signal values (not specifically shown). Such a shift results in a greater number of gradations within each octave. Thus, audio with a relatively low dynamic range (e.g., voice at a whisper) may be captured with greater quantization within each octave, if desired. Likewise audio with high dynamic range (e.g., rock concert in front of the speaker) may be more broadly captured across the dynamic range of human hearing with lesser quantization within each octave, if desired.

In some cases, the gain control is implemented based on commands received from the user of the audio capture system 400. For example, as a precursor to capturing audio for storage to the image memory, the system 400 may be configured to initially capture audio and provide to the user an indication of dynamic range of the audio. As part of capturing the initial audio, the system 400 may enable the user to make gain control adjustments. Once the user has adjusted the gain as desired, the final audio capture may begin. It is noted that the gain (or more mathematically, the base of the logarithm) if adjustable may be stored to the audio sample memory 416 such that in the playback process, discussed more below, the correct anti-log may be taken.

In yet still other embodiments, adjustments to gain may be made by a program executing on the processor 412 without user input. In particular, by performing logarithmic analog-to-digital conversion an automatic system for gain may be implemented. In the "automatic" adjustment example, the system 400 may initially capture audio with each of the gains at a predefined "center" or midrange setting. The processor 412 may analyze the initially capture audio to determine the dynamic range, and may adjust the gain based on the dynamic range, again without user input. For example, the processor 412 may locate within the initially capture audio the mid-point digital signal value, and make a gain adjustment such that the mid-point of the range of the digital signal values substantially matches the mid-point of the initially capture audio (if the initially audio could be re-recorded with the new gain settings). Note that as discussed with respect to FIG. 3 above, related-art systems using linear analog-to-digital conversion could not use the mathematical center of the digital signal values, as the average or mathematical center in those systems turns out to reside in the upper sound intensity octaves.

Figure 7:
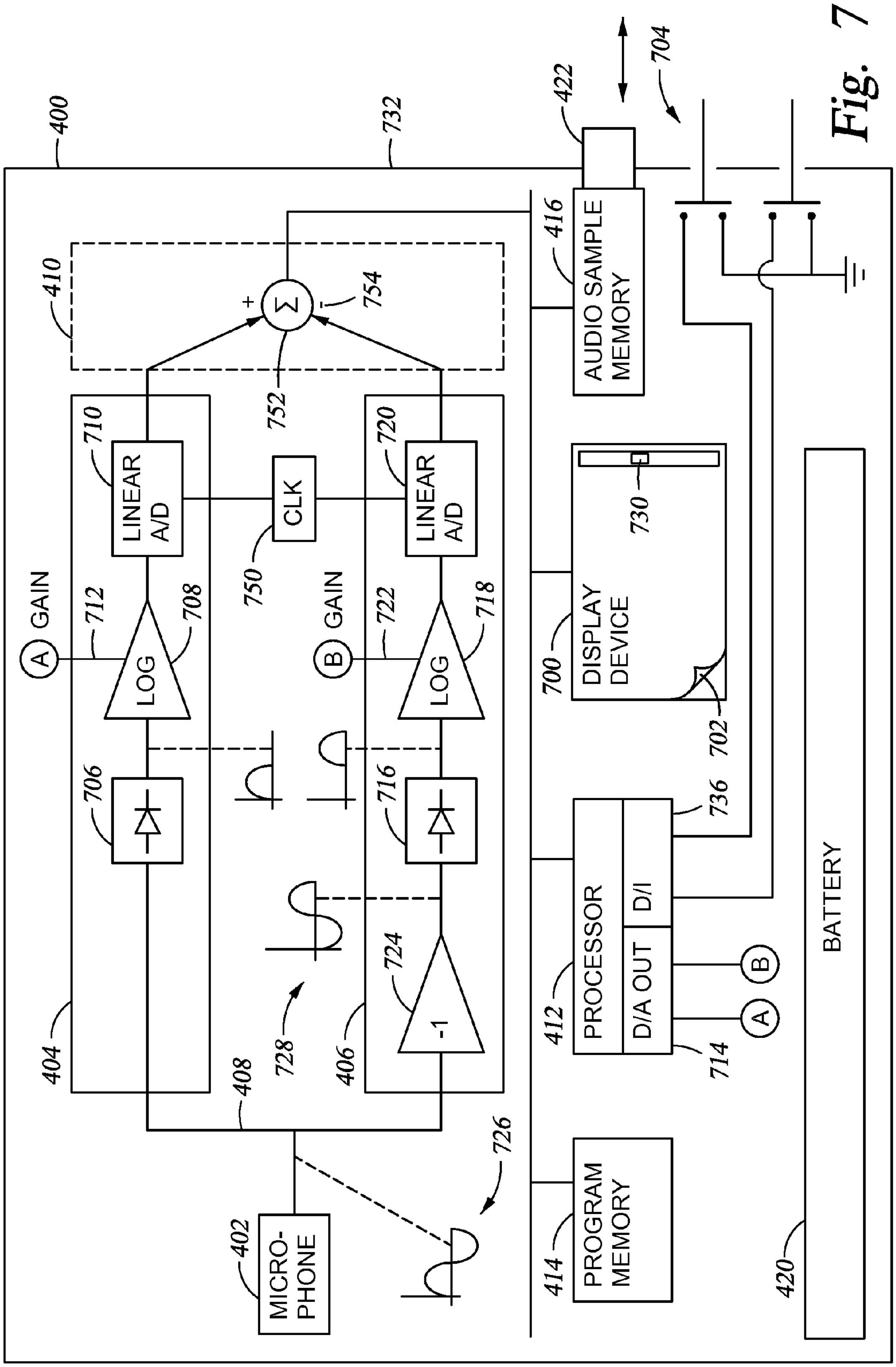
FIG. 7 shows, in block diagram form, an audio capture system in accordance with at least some embodiments.

FIG. 7 shows, in block diagram form, the audio capture system 400 in greater detail in some respects, and with additional illustrative components. In particular, FIG. 7 shows an illustrative implementations of the logarithmic analog-to-digital converter systems 404 and 406, as well as a display device 700 comprising a touchscreen overlay 702 (as shown by a raised corner), and externally accessible switches 704.

The positive logarithmic analog-to-digital converter system 404 in FIG. 7 is illustratively implemented as an active rectifier 706 coupled to the input signal line 408 and thus the microphone 402. The output side of the active rectifier 706 is coupled to a logarithmic amplifier 708, which in turn is coupled to an analog-to-digital converter 710. The active rectifier 706 is a circuit designed to perform half-wave rectification. While a single diode would perform the recited function, the voltage drop across the diode might be large in comparison to the peak voltage of the electrical signal from the microphone 402, and thus an active rectifier (e.g., an active rectifier including a Schottky diode and gain stage) performs the same logical function but with a significantly smaller voltage drop (e.g., on the order of micro-volts).

The amplifier 708 in accordance with these embodiments has a gain response that is logarithmic (e.g., Part No. ADL5310, available from Analog Devices, Inc. of Norwood, Mass.), and the analog-to-digital converter 710 has a linear response (e.g., Part No. LTC2480 16-bit A/D converter available from Linear Technologies of Milpitas, Calif.). That is, the output signal of the amplifier 708 is logarithmically related to the input signal. Logarithmic amplifier 708 may further have a control input, such as a gain control 712. In the illustrative audio capture system 400 the gain control is an analog value and is thus coupled to a digital-to-analog output portion 714 of the processor 412 (such as when the processor 408 is a microcontroller or ASIC). In other cases, an analog value may be created by a digital-to-analog converter distinct from the processor 412, yet communicatively coupled to both the processor 412 and the amplifier 708. In other cases, the gain of the logarithmic amplifier 708 may controlled by way of a digital control signal or signals, and thus the processor 412 may couple to the amplifier by way of a digital communication bus. Regardless of the precise mechanism by which the processor, executing instructions, controls the gain of the amplifier, such control enables the gain control features discussed above.

The negative logarithmic analog-to-digital converter system 406 in FIG. 7 is constructed similarly to that of positive logarithmic analog-to-digital converter 404. In particular, the negative logarithmic analog-to-digital converter system 406 comprises an active rectifier 716 coupled to a logarithmic amplifier 718, which in turn is coupled to a linear analog-to-digital converter 720. The function of the active rectifier 716, the logarithmic amplifier 718, and the linear analog-to-digital converter 720 are the same as the equivalent components in the positive logarithmic analog-to-digital converter system 404, and thus the function of each will not be described again so as not to unduly lengthen the specification. Logarithmic amplifier 718 likewise has a control input, such as a gain control 722 coupled to the digital-to-analog output portion 714 of the processor 412.

The negative logarithmic analog-to-digital converter 406 has an additional component in the form of inverting amplifier 724. That is, the inverting amplifier reverses the sign of the electrical signal created by the microphone. FIG. 7 shows an example sine wave 726 which may be created by the microphone 402. The sine wave 726 is applied both to the positive logarithmic analog-to-digital converter system 404 and the negative logarithmic analog-to-digital converter system 406. However, in the negative logarithmic analog-to-digital converter systems 406, the inverting amplifier 724 inverts the signal prior to the signal being applied to the active rectifier 716. The result produced by the inverting amplifier 724 and active rectifier circuit 716 of the negative logarithmic analog-to-digital converter 406 is that the logarithmic amplifier 718 is only exposed to positive voltages, and more particularly to positive voltages originally related to the negative portions of the electrical signal. The logarithmic amplifier 708 of the positive logarithmic analog-to-digital converter system 404, by not having a leading inverting amplifier, is only exposed to positive voltages, and more particularly to positive voltages originally related to the positive portions of the electrical signal.

The example system 400 of FIG. 7 further comprises a display device 700 coupled to the processor 408 such that various images and interfaces may be displayed. The display device 700 may be any suitable display device, such as a liquid crystal display (LCD) or plasma display. In some embodiments, the display device 700 may be overlaid with a touchscreen overlay 702 (e.g., a capacitive touch screen overlay) such that a user of the imaging system 400 can interact with the instructions executing on the processor by way of the touchscreen overlay 702 and display device 700. As an example of such interaction, the example display device 700 is shown to display a slider bar 730. Thus, by interacting with the slider bar various functionalities may be implemented, such as changing gain.

However, in other cases the user may interact with the programs executing on the processor by way of physical buttons accessible on the outside cover 724 of the audio capture system, such as illustrative externally accessible switches 704. In particular, the illustrative externally accessible switches 704 couple to the processor 412 by way of digital inputs 736 of the processor 412 (such as when the processor 412 is a microcontroller or ASIC). In other cases, the digital values may be read by a digital input device distinct from the processor 412, yet communicatively coupled to both the processor 412 and the externally accessible switches 704. While illustrative externally accessible switches 704 are shown as two normally open pushbutton devices, other types and number of externally accessible switches may be used.

Other Example A/D Converter Systems

Figure 8:
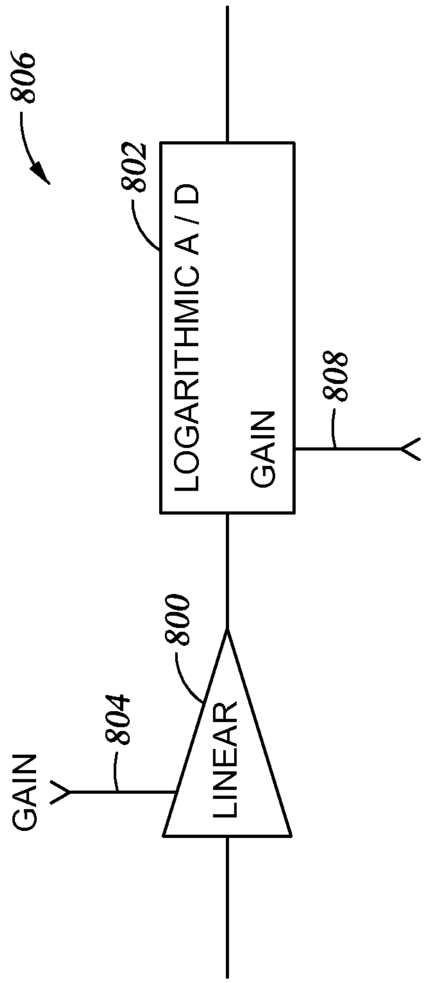
FIG. 8 shows, in block diagram form, a portion of an audio capture system in accordance with at least some embodiments.

The specification to this point has expressly illustrated a logarithmic analog-to-digital conversion, and shown possible implementations of logarithmic analog-to-digital converter systems in FIG. 7. However, further logarithmic analog-to-digital converter systems are also possible. FIG. 8 shows a circuit diagram of another example embodiment of logarithmic analog-to-digital converter systems 806 in accordance with further embodiments. In particular, FIG. 8 shows a linear amplifier 800 (e.g., Part No. LMC6001 amplifier available from Texas Instruments, Inc. of Dallas, Tex.) which may couple on an input side to the microphone (in the case of the positive logarithmic analog-to-digital converter system systems 404) or couple to the inverting amplifier 724 (in the case of the negative logarithmic analog-to-digital converter system 406). Further the example linear amplifier 800 couples on an output side to a logarithmic analog-to-digital converter 802. The linear amplifier 800 in accordance with these embodiments has a gain response that is linear (see equation (1) above and related discussion). That is, the output signal of the amplifier 800 is linearly related to the input signal. Amplifier 706 may further have control inputs, such as a gain control 804. In some cases, the gain control 804 is an analog input coupled to a digital-to-analog output portion of the processor 412 (not specifically shown in FIG. 8). In other cases, the analog value for the gain may be created by a digital-to-analog converter distinct from the processor 412, yet communicatively coupled to both the processor 412 and the amplifier 800. In other cases, the gain of the amplifier 800 may controlled by way of a digital control signal or signals, and thus the processor 412 may couple to the amplifier by way of a digital communication bus. Regardless of the precise mechanism by which the processor, executing instructions, controls the gain of the amplifier, the gain and offset may be controlled as discussed above.

The logarithmic analog-to-digital converter 802 in accordance with these embodiments has a response that is logarithmic. That is, the digital output values created by the logarithmic analog-to-digital converter 802 are logarithmically related to the input signal. Thus, the combination of the linear amplifier 800 and logarithmic analog-to-digital converter 802 may be used to implement some or all the various embodiments discussed above.

Still referring to FIG. 8, in further cases, a logarithmic analog-to-digital converter 802 may itself have a gain input signal 808, which, if present, couples to the processor 412 similar to the gain discussed with the respect to amplifier 800. Thus, the gain control may be implemented in whole or in part by controlling the gain of the logarithmic analog-to-digital converter 802.

Combining the Digital Signal Values

Returning to FIG. 7, regardless of the precise structure of the positive and negative logarithmic analog-to-digital converter systems, each converter system creates a digital value at a time on a corresponding feature of a clock signal created by clock 750 tied to each analog-to-digital converter 710 and 720 (e.g., the feature may be an asserted stated of the clock signal, positive edge of the clock signal, negative edge of the clock signal, or both edges of the clock signal). In some example systems, an identical clock signal is tied to each analog-to-digital converter 710 and 720 such that digital signal values are simultaneously created. Consider first the positive half cycle of the sine wave 726 of FIG. 7. During the positive half cycle, the positive analog-to-digital converter system 404 creates a series of digital values, each digital value representing the instantaneous voltage of the signal. Also during the positive half cycle, the negative analog-to-digital converter system 406 creates a series of digital values, but based on operation of the inverting amplifier 725 and active rectifier 716, the digital signal values created will be at or near a zero value. Any deviation from zero during this portion of the waveform represents noise in the negative analog-to-digital converter system 406.

Now consider the negative half cycle of the sine wave 726 of FIG. 7. During the negative half cycle, the negative analog-to-digital converter system 406 creates a series of (positive) digital values, each digital value representing the absolute value of the instantaneous voltage of the signal. Also during the negative half cycle, the positive analog-to-digital converter system 406 creates a series of digital values, but based on operation of the active rectifier 716, the digital signal values created will be at or near a zero value. Any deviation from zero during this portion of the waveform represents noise in the positive analog-to-digital converter system 406.

Thus, in the example system two digital signal values are created that correspond to the same point in time relative to the sine wave 726. In accordance with some example systems, the dual digital signal values are combined by the combining system 410 to create a single digital signal value for the particular point in time. The combining system may take many forms, but logically the combining system may be viewed as a summation function 752 which adds the digital signal value from the positive logarithmic analog-to-digital converter system 404 with a negative version (as shown by minus sign 754) of the digital signal value created by the negative logarithmic analog-to-digital converter system 406. Stated differently, the summation logic subtracts the digital signal values created by the negative logarithmic analog-to-digital converter system 406 from the digital signal value created by the positive logarithmic analog-to-digital converter system 404. The resultant digital signal value may then be stored by the processor 412.

During the positive half cycle of sine wave 726, the digital signal value produced by the negative logarithmic analog-to-digital converter system 406 will theoretically be zero, and thus will not degrade the representation of the digital signal value created by the positive logarithmic analog-to-digital converter system 404. In practice, a small non-zero value will likely be present in the digital signal value produced by the negative logarithmic analog-to-digital converter system 406, but such will be small in relation to the other digital signal value and thus will not noticeably degrade the quality, or may be considered to cancel similar noise in the positive logarithmic analog-to-digital converter system 404 channel.

During the negative half cycle of sine wave 726, the digital signal value produced by the positive logarithmic analog-to-digital converter system 404 will theoretically be zero, and thus will not degrade the representation of the digital signal value created by the negative logarithmic analog-to-digital converter system 406. In practice, a small non-zero value will likely be present in the digital signal value produced by the positive logarithmic analog-to-digital converter system 404, but such will be small in relation to the other digital signal value and thus will not noticeably degrade the quality, or may be considered to cancel similar noise in the negative logarithmic analog-to-digital converter system 406 channel.

The functionality of the combing system 410 may be implemented in hardware or in software. For example, the functionality of the combining system 410 may be performed by physical logic circuits that read the digital signal value from each system 404 and 406, perform the summation, and then make available the resultant for reading and storage by the processor 412. In other cases, the processor 412 (executed program instructions) may directly read the digital signal values from each system 404 and 406, and perform the summation in software (i.e., the processor performs the summation operation).

In the example systems discussed to this point the final digital signal value associated with each sample of the analog input signal is produced by a summation. The summation is fast and requires no decision-making on the part of the hardware or software. However, it is to be understood that other systems could be implemented as part of the combining system 410. For example, in either hardware or software the two digital signal values may be analyzed, the large non-zero value selected as the "true" digital signal value, and the effectively zero digital signal value discarded. However, analog input signals representing sound pass through the zero often (e.g., for a 20 kHz signal, 40,000 zero-crossings a second), and thus selection of a "true" digital signal value and a discard value during periods when the analog input signal is near zero add complexity.

File Format

Assume for this portion of the discussion that the digital signal values created by the converter systems 404 and 406 have been combined and/or selected in some fashion, hereafter the "sampled digital signal value." In accordance with at least some embodiments, each sampled digital value created may be stored to the image memory 412, such as a series of digital values, each digital signal value representing the instantaneous voltage of the analog input signal at a particular point in time. For example, for a 10-bit logarithmic analog-to-digital conversion system, each digital value may be 10 bits, with an associated sign bit, for a total of 11 bits for each sample. Moreover, as mentioned above, an indication of the base of the logarithmic analog-to-digital conversion may likewise be stored. Assuming the same base across the entire recording, an indication of the base need only be stored one time.

However, in other embodiments the file format may take advantage of the use of octaves. In particular, in some embodiments the digital values in the image memory 412 are stored as a value indicative of octave (which may also be referred to as a radix), a value indicative of graduation or quantization within the octave (the graduation may also be referred to as a mantissa), and a value indicative of sign. Consider, for example, a 10-bit logarithmic analog-to-digital conversion having eight octaves. As discussed with respect to Table 5, there are 128 graduations or quantization steps within each of the illustrative octaves. Storing the digital values in this example thus involves, for each digital signal value, storing a 3-bit indication of octave ($2^3$=8), a 7-bit indication of graduation or quantization within the octave ($2^7$=128), and a 1-bit indication of color.

Many times in sampling periodic or near periodic waveforms many consecutive sample values may reside within the same octave. By storing digital values based on octave and gradation within the octave, for groups of samples within the same octave the bits related to octave may be omitted. For example, consider a file storage format where, as a default, each digital value comprises a value indicative sign, followed by a value indicative of octave, and then followed by a value indicative of gradation within the octave. In the example system, when a series digital signal values all reside within the same octave, a designator may be inserted into the file along with an indication of the octave, and an indication of the number of subsequent samples to which the octave applies. For the next number of designated samples, only the mantissa (i.e., the gradation within the octave) may be written to the file, omitting the octave.

Note, however, that the example storage systems result in a "lossless" storage of audio data. No compression or loss of data is used in the storage. Thus, the audio reproduction need not suffer based on loss of data for the compression. Finally, while the example system either combines the digital signal values, or selects one of the digital signal values to be the sampled digital signal value, it is possible to omit the combing system 410, and store both the digital signal values corresponding to the same time. During reproduction, the digital signal values corresponding to the same point in time may be combined as discussed, or the reproduction system may implement the selection of the digital sample to be provided to a digital-to-analog converter. While storing both values increases the size of the storage file, there may be advantages (e.g., advantages in post-processing of the data) in such systems.

Single Logarithmic A/D Converter Systems

Figure 9:
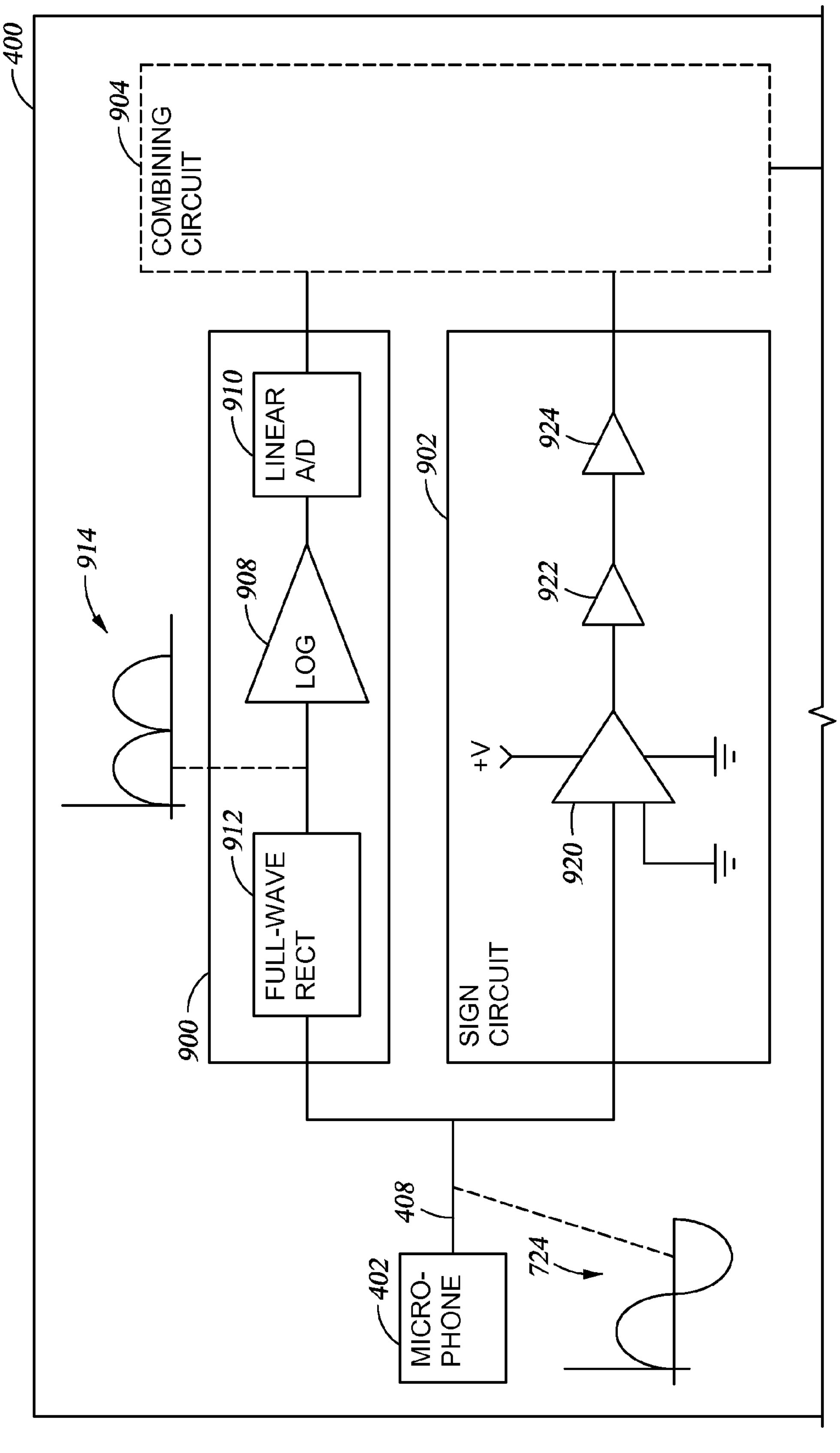
FIG. 9 shows, in block diagram form, a portion of an audio capture system in accordance with at least some embodiments.

The various example systems discussed to this point have been based on having a separate positive logarithmic analog-to-digital converter system and negative logarithmic analog-to-digital converter system. However, in yet still other example systems a single logarithmic analog-to-digital converter system may be used, in combination with a circuit to indicate sign. FIG. 9 shows, in block diagram form, a partial audio recording system 400. In particular, FIG. 9 shows a microphone 402 coupled to an input signal line 408. The input signal line couples to a logarithmic analog-to-digital converter system 900, and a sign circuit 902. The logarithmic analog-to-digital converter system 900 creates a digital value couple to the combining circuit 904, and the sign circuit 902 creates a bit indicative of the instantaneous sign of the input waveform (illustratively shown as sine wave 724).

Turning first to the logarithmic analog-to-digital converter system 900. The logarithmic analog-to-digital converter system 900 is similar to the logarithmic analog-to-digital converter systems previously discussed, in that the logarithmic analog-to-digital converter system comprises a logarithmic amplifier 908 and a linear analog-to-digital converter 910. The operation of the logarithmic amplifier 908 and linear analog-to-digital converter 910 are the same as discussed above, and thus the operation of the devices will not be repeated again here. The logarithmic analog-to-digital converter system 900 also comprises an active rectifier circuit 912. Unlike the previous active rectifier circuits which perform half-wave rectification, active rectifier circuit 912 performs full-wave rectification. Thus, as shown by waveform 914, negative portions of the analog input signal are provided to the logarithmic amplifier 908 as positive portions. Thus, the logarithmic amplifier 908 and linear analog-to-digital converter 910 produce all the digital signal values.

Negative portions of the analog input signal are indicated to the combining circuit 904 by way of the sign circuit 902. In particular, during periods of time when the analog input signal is positive, the sign circuit 902 provides an indication to the combining circuit 904 that the digital signal values created are for positive values. During periods of time when the analog input signal is negative, the sign circuit 902 provides an indication to the combining circuit 904 that the digital signal values created are for negative values. For example, the sign circuit 902 may provide a single Boolean value to the combining circuit 904 indicative of the sign of analog input signal corresponding to the each sample. There are a variety of physical circuits which may be used to implement the functionality of the sign circuit 902. FIG. 9 shows one example circuit in the form of an operation amplifier 920 operated in as an open loop amplifier with one input single line coupled to the analog input signal and the second input coupled to ground or common. Operated as an open loop amplifier, and assuming sufficient open loop gain, the operational amplifier 920 will quickly saturate to the positive rail voltage ("+V") when the analog input voltage is positive, and likewise quickly saturate to the negative rail voltage (here ground or common) when the analog input voltage is negative. The example sign circuit 902 also comprises buffers 922 and 924 indicative of controlling timing of the signal propagation through the sign circuit to account for propagation delays through the logarithmic analog-to-digital converter system 900. That is, buffers 922 and 924 indicate that timing is controlled such that the sign indication provided to the combining circuit 904 corresponds to the digital signal value created by the linear analog-to-digital converter 910. Other sign circuits may be equivalently implemented.

The combining circuit 904 is configured to combine each digital signal value and sign value in some way. In one example system, the combining circuit merely concatenates the sign bit with the digital signal value for reading by the processor (not shown in FIG. 9). In other cases, the combining may involve further modification (e.g., a two's complement conversion of the digital signal value when the sign bit indicates a negative).

Playback Considerations

Playback of captured audio follows directly from the file storage format. Any portion of the logarithmically converted data may be played back directly. Alternatively, because the stored values directly indicate the stored value of the instantaneous voltage of the electrical signal, each stored value may be raised to the appropriate base power based on the base used in the recording stage, apply the digital value to a digital-to-analog converter to create an analog signal, and apply the analog signal to an amplifier and speaker(s). For example, if the recording stage performed logarithmic analog-to-digital conversion as a base 2 log (i.e., each datum proportional to $\log_2$(instantaneous voltage), then in playback each datum is raised to the base (e.g., $2^{[datum]}$ in this example) before being applied to the digital-to-analog converter. In cases where the stored values are encoded as an octave and gradation within the octave, the playback system may read the octave and gradation, produce an appropriate digital value (again taking into account the base power used during storage), apply the digital value to a digital-to-analog converter to create an analog signal, and apply the analog signal to an amplifier and speaker(s).

Returning to FIG. 4, FIG. 4 also shows example embodiments of a playback system. It is noted that while the playback system is incorporated with the recording system of FIG. 4, in other cases the playback system and recording system may be separate devices. In particular, FIG. 4 shows that system 400 may further comprise a digital-to-analog converter 450 coupled to the processor 412 on a digital side, and the digital-to-analog converter 450 coupled to an amplifier 452 on an analog side. The amplifier 452, in turn, is coupled to a speaker 454. Thus, in playback the system 400, and particularly the processor 412 (executing instructions), may read digital values from the audio sample memory 416, each digital value a successive sample in time of the audio signal to be recreated. For each digital value, the processor may create an anti-log value according to the base used in the logarithmic analog-to-digital conversion during the recording. Once the analog signal is available on the analog side of the digital-to-analog converter 450, the amplifier may amplify the signal and apply the amplified signal to the speaker 454. Thus, the audio signal recorded is played back over the speaker.

The precise anti-log function may depend on the philosophy implemented by the recording system. In cases where a single digital value is stored for each sampled time, the playback may involve reading the single digital value, performing the anti-log function, and applying the anti-log value to the digital-to-analog converter 450. On the other hand, if the processor 412 stores two values for each sampled time (one for the positive logarithmic analog-to-digital conversion and one from the negative logarithmic analog-to-digital conversion), the processor may (at the time of playback) read both values and combine them to create the digital value applied to the digital-to-analog converter 450.

In some cases, the amplifier 452 may implement gain control at the direction of the processor 412, as shown by the connection 456 between the processor 412 and the amplifier 452. The connection 456 may be an analog connection, where the gain is proportional to the value of the analog signal, or the connection may be a digital communication channel, where the gain is encoded in a digital value exchanged between the processor 412 and the amplifier 452.

It is noted that the various aspects of the playback features need not necessarily play back only audio recorded within the same system. Moreover, while FIG. 4 shows only one audio channel, there may be two or more audio channels, and each channel may have its own digital-to-analog converter 450, amplifier 452 and speaker 454. Finally, while FIG. 4 shows the playback system in conjunction with a system implementing dedicated logarithmic analog-to-digital conversion for each of the positive portion and dedicated portions, the playback system is equally functional with the systems of FIG. 9.

Figure 10:
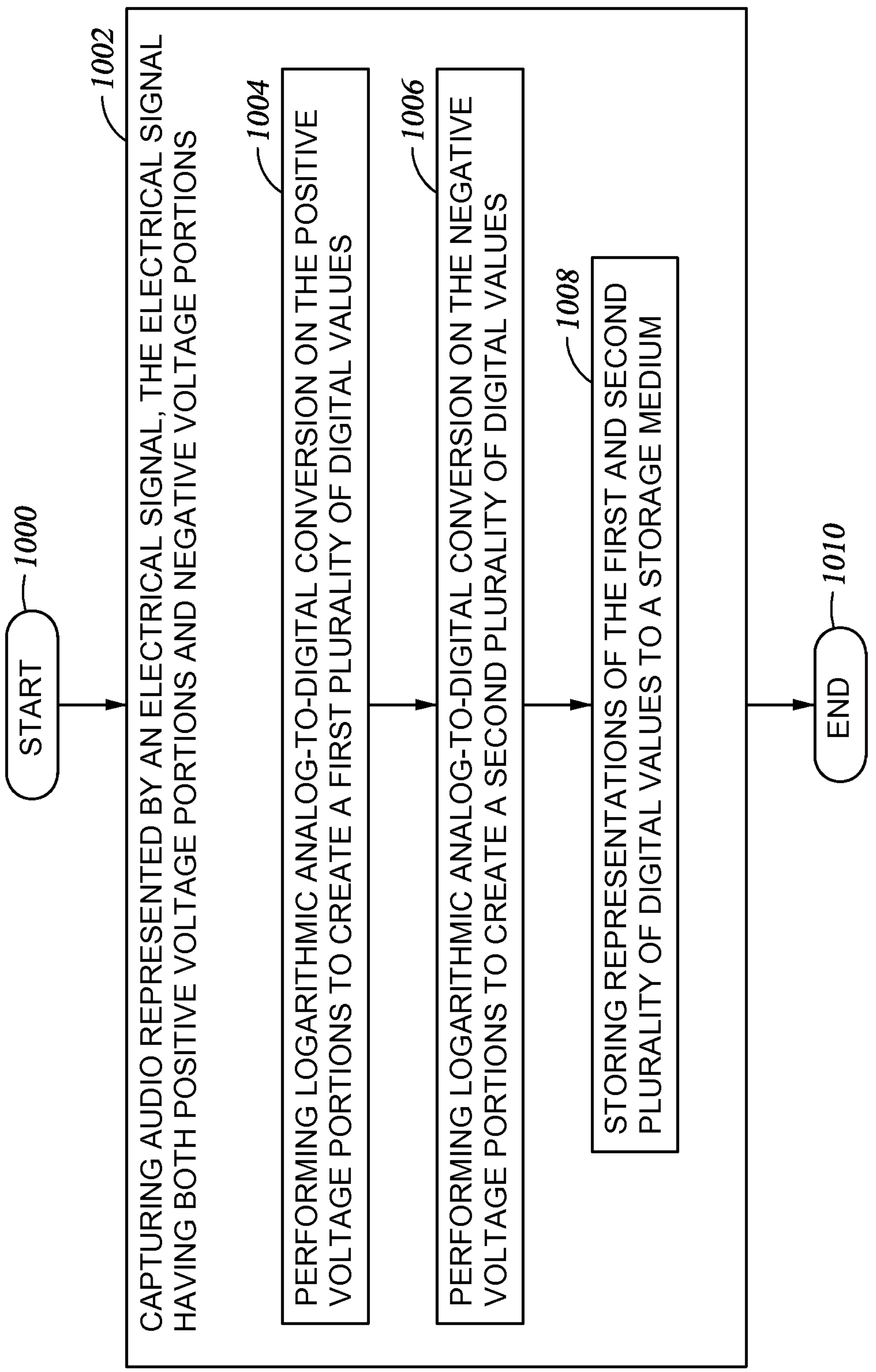
FIG. 10 shows a method in accordance with at least some embodiments.

FIG. 10 shows a method in accordance with at least some embodiments. The method may be performed, in part, by instructions executing on a processor. In particular, the method starts (block 1000) and comprises capturing audio represented by an electrical signal, the electrical signal having both positive voltage portions and negative voltage portions (block 1002). In some cases, the capturing may be performed by: performing logarithmic analog-to-digital conversion on the positive voltage portions to create a first plurality of digital values (block 1004); performing logarithmic analog-to-digital conversion on the negative voltage portions to create a second plurality of digital values (block 1006); and storing representations of the first and second plurality of digital values to a storage medium (block 1008). Thereafter, the method ends (block 1010), in many cases to be restarted on the next sample.

Figure 11:
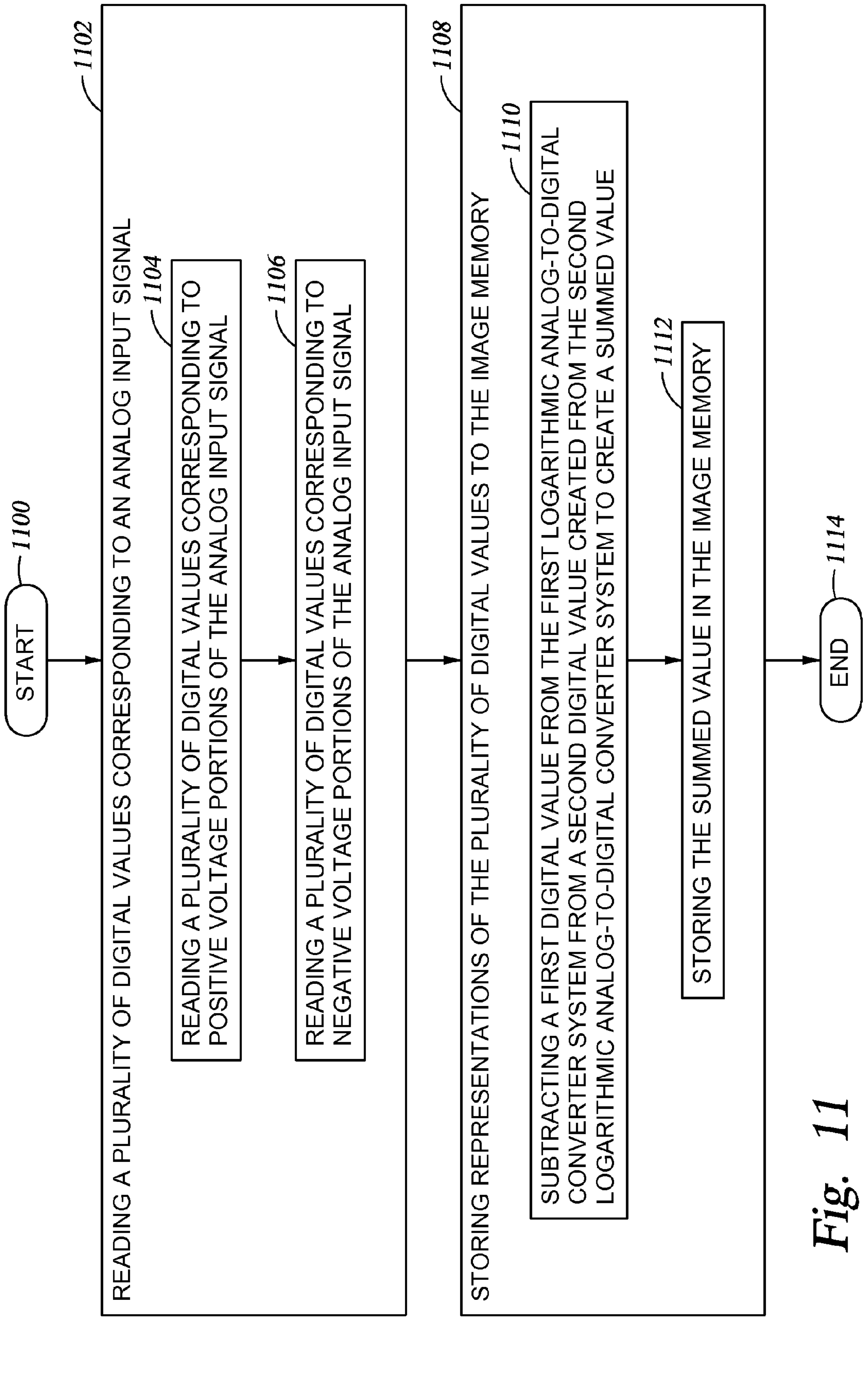
FIG. 11 shows a method in accordance with at least some embodiments

FIG. 11 shows a method in accordance with at least some embodiments. The method may be performed by instructions executing on a processor. The method may start (block 1100) and comprise reading a plurality of digital values corresponding to an analog input signal (block 1102). In some example systems the reading may comprise: reading a plurality of digital values corresponding to positive voltage portions of the analog input signal (block 1104); and reading a plurality of digital values corresponding to negative voltage portions of the analog input signal (block 1106). The illustrative method may then comprise storing representations of the plurality of the digital values to the image memory (block 1108). In cases where two digital values are read, the storing may comprise: subtracting a first digital value from the first logarithmic analog-to-digital converter system from a second digital value created from the second logarithmic analog-to-digital converter system to create a summed value (block 1110); and storing the summed value in the image memory (block 1112). Thereafter, the method ends (block 1114), in many cases to be restarted on the next sample.

From the description provided herein, those skilled in the art are readily able to combine software created as described with appropriate general-purpose or special-purpose computer hardware to create a computer system and/or computer sub-components in accordance with the various embodiments, to create a computer system and/or computer sub-components for carrying out the methods of the various embodiments, and/or to create a non-transitory computer-readable storage medium (i.e., other than an signal traveling along a conductor or carrier wave) for storing a software program to implement the method aspects of the various embodiments.

References to "one embodiment," "an embodiment," "some embodiments," "various embodiments", "example embodiments", "example systems" or the like indicate that a particular element or characteristic is included in at least one embodiment of the invention. Although the phrases may appear in various places, the phrases do not necessarily refer to the same embodiment.

The above discussion is meant to be illustrative of the principles and various embodiments of the present invention. Numerous variations and modifications will become apparent to those skilled in the art once the above disclosure is fully appreciated. It is intended that the following claims be interpreted to embrace all such variations and modifications.

What is claimed is:

1. A method comprising:

capturing audio represented by an electrical signal, the electrical signal having both positive voltage portions and negative voltage portions, the capturing by performing logarithmic analog-to-digital conversion on the positive voltage portions to create a first plurality of digital values;

performing logarithmic analog-to-digital conversion on the negative voltage portions to create a second plurality of digital values; and storing representations of the first and second plurality of digital values to a storage medium.

2. The method of claim 1:

wherein performing logarithmic analog-to-digital conversion on the positive voltage portions further comprises:

applying the electrical signal to an amplifier whose gain response is logarithmic to create a first modified signal; and then applying the first modified signal to a linear analog-to-digital converter;

wherein performing logarithmic analog-to-digital conversion on the negative voltage portions further comprises:

inverting the electrical signal to create an inverted signal; and then applying the inverted signal to an amplifier whose gain response is logarithmic to create a second modified signal; and then applying the second modified signal to a linear analog-to-digital converter.

3. The method of claim 2:

prior to applying the electrical signal to the amplifier, rectifying the electrical signal; and prior to applying the inverted signal, rectifying the inverted signal.

4. The method of claim 1:

wherein performing logarithmic analog-to-digital conversion on the positive voltage portions further comprises:

applying the electrical signal to a first amplifier whose gain response is logarithmic to create a first modified signal; and then applying the first modified signal to a first linear analog-to-digital converter;

wherein performing logarithmic analog-to-digital conversion on the negative voltage portions further comprises:

applying the electrical signal to a second amplifier whose gain response is logarithmic to create a second modified signal, the second amplifier distinct from the first amplifier; and then applying the second modified signal to a second linear analog-to-digital converter, the second linear analog-to-digital converter distinct from the first linear analog-to-digital converter.

5. The method of claim 4:

prior to applying the electrical signal to the first amplifier, rectifying the electrical signal; and prior to applying the inverted signal to second the amplifier, rectifying the inverted signal.

6. The method of claim 1 wherein storing representations of the plurality of digital values further comprises storing, for at least some of the digital values, a combination of a value indicative of an octave and a value indicative of gradation within the octave.

7. The method of claim 6 wherein storing further comprises storing an indication of a sign represented by the value indicative of octave and value indicative of gradation within the octave.

8. The method of claim 1:

wherein performing logarithmic analog-to-digital conversion on the positive voltage portions further comprises create a first plurality of digital values, each digital value created responsive to a feature of a clock signal;

wherein performing logarithmic analog-to-digital conversion on the negative voltage portions further comprises create a second plurality of digital values, each digital value created responsive to the feature of the clock signal;

wherein storing representations further comprises subtracting digital values from the second plurality of digital values from corresponding digital values from the first plurality of digital values, each subtraction creates a combined value; and storing each combined value.

9. The method of claim 8 wherein storing each combined value further comprises storing a combination of a value indicative of an octave, a value indicative of gradation within the octave, and an indication of the sign of the combined value.

10. The method of claim 1 wherein capturing audio further comprises capturing by at least one selected from the group consisting of: a mobile device; a mobile cellular device; and sound recording equipment.

11. The method of claim 1 further comprising:

playing back the audio by reading a first representation of the first and second digital values, the reading by a processor from a memory;

creating an anti-log value, the anti-log value based on the first representation and a base of the logarithmic analog-to-digital conversion;

applying the anti-log value to a digital-to-analog converter; and repeating the reading, creating, and applying for a plurality of representations stored in the memory.

12. The method of claim 11 further comprising:

wherein storing representations further comprises storing an indication of a base of the logarithmic analog-to-digital conversion;

determining a base of the logarithmic analog-to-digital conversion; and wherein creating the anti-log value further comprises creating the anti-log values based on the base of the logarithmic analog-to-digital conversion.

13. A system comprising:

an input signal line configured to couple to an analog input signal representing audio, the analog input signal having both positive voltage portions and negative voltage portions;

a first logarithmic analog-to-digital converter system that defines an analog side and a digital side, the analog side coupled to the input signal line, the first logarithmic analog-to-digital converter system configured to produce digital values representing the positive voltage portions of the analog input signal;

a second logarithmic analog-to-digital converter system that defines an analog side and a digital side, the analog side of the second logarithmic analog-to-digital converter system coupled to the input signal line, the second logarithmic analog-to-digital converter system configured to produce digital values representing the negative voltage portions of the analog input signal;

a processor;

a program memory coupled to the processor;

an audio sample memory coupled to the processor;

the program memory storing a program that, when executed by the processor, causes the processor to:

read a plurality of digital values corresponding to the analog input signal; and store representations of the plurality of the digital values to the audio sample memory.

14. The system of claim 13 wherein when the processor reads, the program further causes the processor to:

read a plurality of digital values corresponding to positive voltage portions of the analog input signal; and read a plurality of digital values corresponding to negative voltage portions of the analog input signal.

15. The system of claim 14 wherein when the processor stores the representations, the program further causes the processor to:

subtract a first digital value from the first logarithmic analog-to-digital converter system from a second digital value created from the second logarithmic analog-to-digital converter system to create a summed value; and store the summed value in the audio sample memory.

16. The system of claim 13 further comprising a microphone coupled to the input signal line, the microphone configured to create the input signal representing audio.

17. The system of claim 13 wherein when the processor stores representations, the program causes the processor to store, for each representation, a value indicative of an octave and a value indicative of gradation within the octave.

18. The system of claim 13 further comprising:

a summation logic that defines a first input, a second input and an output, the first input coupled to the first logarithmic analog-to-digital converter system, the second input coupled to the second logarithmic analog-to-digital converter system, and the summation logic sums corresponding digital values from the logarithmic analog-to-digital converter systems;

wherein when the processor reads the plurality of digital values, the program causes the processor to read from the summation logic.

19. The system of claim 13 wherein the first logarithmic analog-to-digital converter system further comprises:

a first amplifier coupled to the input signal line, the first amplifier produces a first analog output signal logarithmically related to the analog input signal; and a first linear analog-to-digital converter coupled to the first analog output signal of the first amplifier.

20. The system of claim 19 wherein the first logarithmic analog-to-digital converter system further comprises:

an inverter circuit coupled to the input signal line, the inverter circuit produces an inverted signal;

a second amplifier coupled to the inverted signal, the second amplifier produces a second analog output signal logarithmically related to the inverter signal; and a second linear analog-to-digital converter coupled to the second analog output signal of the second amplifier.

21. The system of claim 13 further comprising:

a digital-to-analog converter coupled to the processor;

a power amplifier coupled to the digital-to-analog converter;

a speaker coupled to the power amplifier;

wherein the program further causes the processor to:

read a first representation of the plurality of digital values from the audio sample memory;

create an anti-log value, the anti-log value based on the first representation and a base of the logarithmic analog-to-digital conversion;

apply the anti-log value to the digital-to-analog converter; and repeat the reading, creating, and applying for a plurality of representations stored in the memory.

22. The system of claim 21 further comprising:

wherein the program further causes the processor to store an indication of a base of the logarithmic analog-to-digital conversion;

wherein prior to creating the anti-log value, the program further causes the processor to read an indication of the base of the logarithmic analog-to-digital conversion from the audio sample memory thereby creates a determined value; and wherein when the processor creates the anti-log value, the program further causes the processor to create the anti-log values based on the determined value.

23. A system comprising:

a processor;

a program memory coupled to the processor;

an audio sample memory coupled to the processor;

a digital-to-analog converter coupled to the processor;

an amplifier coupled to the digital-to-analog converter;

a speaker coupled to the amplifier;

the program memory storing a program that, when executed by the processor, causes the processor to play audio stored on the audio sample memory by causing the processor to:

read a first digital value from a plurality of digital values stored in the audio sample memory, the plurality of digital values represent an audio signal;

create an anti-log value, the anti-log value based on the first digital value and a base of a logarithmic analog-to-digital conversion used to create the plurality of digital values;

apply a representation of the anti-log value to the digital-to-analog converter; and repeat the reading, creating, and applying for the each of the plurality of digital values.

24. The system of claim 23:

wherein prior to creation of the anti-log value, the program further causes the processor to read an indication of the base of the logarithmic analog-to-digital conversion from the audio sample memory which thereby creates a determined value; and wherein when the processor creates the anti-log value, the program causes the processor to create the anti-log values based on the determined value.

25. The system of claim 23:

wherein, prior to creation of the anti-log values, the program causes the processor to:

read a second digital value, the first digital value corresponding to a positive portion of an analog signal and the second digital value corresponding to a negative portion of the analog signal at about the same point in time; and combine the first and second digital values to create a combined value;

wherein when the processor creates the anti-log value, the program causes the processor create the anti-log value based on the combined value.

* * * * *